US010574199B2

United States Patent
Hori et al.

(10) Patent No.: US 10,574,199 B2
(45) Date of Patent: Feb. 25, 2020

(54) AMPLIFIER AND TRANSMITTER, AND TRANSMISSION METHOD

(71) Applicant: NEC Corporation, Minato-ku, Tokyo (JP)

(72) Inventors: Shinichi Hori, Tokyo (JP); Tomoyuki Yamase, Tokyo (JP); Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/772,888

(22) PCT Filed: Nov. 8, 2016

(86) PCT No.: PCT/JP2016/083080
§ 371 (c)(1),
(2) Date: May 2, 2018

(87) PCT Pub. No.: WO2017/082243
PCT Pub. Date: May 18, 2017

(65) Prior Publication Data
US 2018/0331665 A1 Nov. 15, 2018

(30) Foreign Application Priority Data

Nov. 11, 2015 (JP) .................................. 2015-220991
Aug. 30, 2016 (JP) .................................. 2016-167964

(51) Int. Cl.
*H03F 3/217* (2006.01)
*H03F 3/68* (2006.01)
(Continued)

(52) U.S. Cl.
CPC .............. *H03F 3/217* (2013.01); *H03F 1/56* (2013.01); *H03F 3/211* (2013.01); *H03F 3/2175* (2013.01);
(Continued)

(58) Field of Classification Search
CPC .......... H03F 3/217; H03F 3/245; H03F 3/211; H03F 1/56; H03F 3/2175; H03F 3/24;
(Continued)

(56) References Cited

U.S. PATENT DOCUMENTS

2008/0290938 A1* 11/2008 Gupta ................... H03F 3/2178
330/127
2012/0262214 A1 10/2012 Hori
2015/0263768 A1 9/2015 Hori et al.

FOREIGN PATENT DOCUMENTS

JP 2011-091757 A 5/2011
JP 5360232 B2 12/2013
(Continued)

OTHER PUBLICATIONS

Antoine Frappe et al., "A digital $\Delta\Sigma$ RF signal generator for mobile communication transmitters in 90nm CMOS", IEEE Radio Frequency Integrated Circuits Symposium, pp. 13-16, 2008.
(Continued)

*Primary Examiner* — Khanh V Nguyen
*Assistant Examiner* — Khiem D Nguyen

(57) ABSTRACT

The purpose of the present invention is to provide an amplifier having high signal-to-noise ratio of a transmitted signal and high electrical efficiency. Another purpose is to suppress complexity of amplifier's wiring connecting a signal generator that generates a binary digital signal and an amplification unit that amplifies the same. This amplifier generates a binary digital signal. The amplifier further generates a K-value digital signal (K is an integer greater than or equal to 3) from the binary digital signal and generating a plurality of binary digital signals from the K-value digital signal. The amplifier amplifies each of the plurality of binary digital signals, and combines the plurality of amplified binary digital signals and generating a combined signal having a substantially proportional relationship with the K-value digital signal.

19 Claims, 23 Drawing Sheets

(51) Int. Cl.
*H04B 1/04* (2006.01)
*H04L 25/49* (2006.01)
*H03F 3/21* (2006.01)
*H03F 1/56* (2006.01)
*H03F 3/24* (2006.01)

(52) U.S. Cl.
CPC ............... *H03F 3/24* (2013.01); *H03F 3/245* (2013.01); *H03F 3/68* (2013.01); *H04B 1/04* (2013.01); *H04L 25/49* (2013.01); *H03F 2200/387* (2013.01); *H03F 2200/411* (2013.01); *H04B 2001/0408* (2013.01)

(58) Field of Classification Search
CPC .................. H03F 3/68; H03F 2200/411; H03F 2200/387; H04L 25/49; H04B 1/04; H04B 2001/0408
USPC .................................................. 330/251, 295
See application file for complete search history.

(56) References Cited

FOREIGN PATENT DOCUMENTS

WO    2014/042270 A1    3/2014
WO    2015/114702 A1    8/2015

OTHER PUBLICATIONS

K. Motoi et al., "Digital Doherty Transmitter with Envelope ΔΣ Modulated Class-D GaN Power Amplifier for 800 MHz band", IEEE, MTT-S International Microwave Symposium, total 4 pages, 2014.

International Search Report dated Jan. 31, 2017, in counterpart International Application No. PCT/JP2016/083080.

* cited by examiner

Fig.11

| DIGITAL LOCAL SIGNAL (I-SIDE) | 1 | 0 | -1 | -1 | 0 | 1 | 0 | -1 | 0 |
|---|---|---|---|---|---|---|---|---|---|
| DIGITAL LOCAL SIGNAL (Q-SIDE) | 0 | 1 | 0 | -1 | 0 | 1 | 0 | 0 | -1 |
| INPUT SIGNAL | d1 | d2 | d3 | d4 | d5 | d6 | d7 | d8 | |
| DQDC OUTPUT (I-SIDE) | d1 | 0 | -d3 | 0 | d5 | 0 | -d7 | 0 | |
| DDQDC OUTPUT (Q-SIDE) | 0 | d2 | 0 | -d4 | 0 | d6 | 0 | -d8 | |
| DS OUTPUT (I-SIDE) | d1 | | -d3 | | d5 | | -d7 | | |
| DS OUTPUT (Q-SIDE) | | d2 | | -d4 | | d6 | | -d8 | |

Fig.12

| | | | | | | |
|---|---|---|---|---|---|---|
| DIGITAL LOCAL SIGNAL (I-SIDE) | 1 | 0 | -1 | 0 | 1 | 0 |
| DIGITAL LOCAL SIGNAL (Q-SIDE) | 0 | 1 | 0 | -1 | 0 | -1 |
| FIR FILTER OUTPUT (I-SIDE) | I1 | I2 | I3 | I4 | | |
| FIR FILTER OUTPUT (Q-SIDE) | Q1 | Q2 | Q3 | Q4 | | |
| CODE CONVERTER OUTPUT (EIGHTH AMPLIFIER, I-SIDE) | I1A | I2A | I3A | I4A | | |
| CODE CONVERTER OUTPUT (NINTH AMPLIFIER, I-SIDE) | I1B | I2B | I3B | I4B | | |
| CODE CONVERTER OUTPUT (EIGHTH AMPLIFIER, Q-SIDE) | Q1A | Q2A | Q3A | Q4A | | |
| CODE CONVERTER OUTPUT (NINTH AMPLIFIER, Q-SIDE) | Q1B | Q2B | Q3B | Q4B | | |
| DQUC OUTPUT (EIGHTH AMPLIFIER) | I1A | Q1A | -I2A | -Q2A | I3A | Q3A | -I4A | -Q4A |
| DQUC OUTPUT (NINTH AMPLIFIER) | I1B | Q1B | -I2B | -Q2B | I3B | Q3B | -I4B | -Q4B |

Fig.20

| | | | | | | | |
|---|---|---|---|---|---|---|---|
| DIGITAL LOCAL SIGNAL (I-SIDE) | 1 | 0 | -1 | 0 | 1 | 0 | -1 | 0 |
| DIGITAL LOCAL SIGNAL (Q-SIDE) | 0 | 1 | 0 | -1 | 0 | 1 | 0 | -1 |
| FIR FILTER OUTPUT SIGNAL (I-SIDE) | I1 | I2 | I3 | I4 | | | | |
| FIR FILTER OUTPUT SIGNAL (Q-SIDE) | Q1 | Q2 | Q3 | Q4 | | | | |
| DIGITAL MIXER OUTPUT (I-SIDE) | I1 | -I2 | I3 | -I4 | | | | |
| DIGITAL MIXER OUTPUT (Q-SIDE) | Q1 | -Q2 | Q3 | -Q4 | | | | |
| CODE CONVERTER OUTPUT (EIGHTH AMPLIFIER, I-SIDE) | I1A' | I2A' | I3A' | I4A' | | | | |
| CODE CONVERTER OUTPUT (NINTH AMPLIFIER, I-SIDE) | I1B' | I2B' | I3B' | I4B' | | | | |
| CODE CONVERTER OUTPUT (EIGHTH AMPLIFIER, Q-SIDE) | Q1A' | Q2A' | Q3A' | Q4A' | | | | |
| CODE CONVERTER OUTPUT (NINTH AMPLIFIER, Q-SIDE) | Q1B' | Q2B' | Q3B' | Q4B' | | | | |
| SELECTOR OUTPUT (EIGHTH AMPLIFIER) | I1A' | Q1A' | I2A' | Q2A' | I3A' | Q3A' | I4A' | Q4A' |
| SELECTOR OUTPUT (NINTH AMPLIFIER) | I1B' | Q1B' | I2B' | Q2B' | I3B' | Q3B' | I4B' | Q4B' |

Fig.22

| | | | | | | | | |
|---|---|---|---|---|---|---|---|---|
| INPUT SIGNAL | d1 | d2 | d3 | d4 | d5 | d6 | d7 | d8 |
| SELECTOR OUTPUT (I-SIDE) | d1 | 0 | d3 | 0 | d5 | 0 | d7 | 0 |
| SELECTOR OUTPUT (Q-SIDE) | 0 | d2 | 0 | d4 | 0 | d6 | 0 | d8 |
| DS OUTPUT (I-SIDE) | d1 | | d3 | | d5 | | d7 | |
| DS OUTPUT (Q-SIDE) | | d2 | | d4 | | d6 | | d8 |
| FIR FILTER OUTPUT SIGNAL (I-SIDE) | I1 | | I2 | | I3 | | I4 | |
| FIR FILTER OUTPUT SIGNAL (Q-SIDE) | | Q1 | | Q2 | | Q3 | | Q4 |
| CODE CONVERTER OUTPUT (EIGHTH AMPLIFIER, I-SIDE) | I1A' | | I2A' | | I3A' | | I4A' | |
| CODE CONVERTER OUTPUT (NINTH AMPLIFIER, I-SIDE) | I1B' | | I2B' | | I3B' | | I4B' | |
| CODE CONVERTER OUTPUT (EIGHTH AMPLIFIER, Q-SIDE) | | Q1A' | | Q2A' | | Q3A' | | Q4A' |
| CODE CONVERTER OUTPUT (NINTH AMPLIFIER, Q-SIDE) | | Q1B' | | Q2B' | | Q3B' | | Q4B' |
| SELECTOR OUTPUT (EIGHTH AMPLIFIER) | I1A' | Q1A' | I2A' | Q2A' | I3A' | Q3A' | I4A' | Q4A' |
| SELECTOR OUTPUT (NINTH AMPLIFIER) | I1B' | Q1B' | I2B' | Q2B' | I3B' | Q3B' | I4B' | Q4B' |

AMPLIFIER AND TRANSMITTER, AND TRANSMISSION METHOD

This application is a National Stage Entry of PCT/JP2016/083080 filed on Nov. 8, 2016, which claims priority from Japanese Patent Application 2015-220991 filed on Nov. 11, 2015 and Japanese Patent Application 2016-167964 filed on Aug. 30, 2016, the contents of all of which are incorporated herein by reference, in their entirety.

TECHNICAL FIELD

The present invention relates to a transmitter used in a communication system such as a mobile telephone and a wireless local area network (LAN).

BACKGROUND ART

A transmitter used in a communication system such as a mobile telephone and a wireless LAN is required to maintain a high-precision transmission waveform and also operate with low power consumption, without depending on intensity of transmission power. Particularly, a power amplifier for transmission provided at a final stage of a transmitter consumes high power, and is therefore required to have high power efficiency.

In recent years, a switching amplifier has been drawing attention as a power amplifier expected to have high power efficiency. A switching amplifier is assumed to have a pulse waveform signal as an input signal, and amplifies power while maintaining a waveform of the pulse waveform signal. After a frequency component other than a desired frequency component is suppressed by a filter element, the pulse waveform signal amplified by the switching amplifier is emitted into air by an antenna.

FIG. 14 is a circuit diagram illustrating an amplifier called a class-D or class-S amplifier (hereinafter, representatively referred to as a class-D amplifier) which is a typical example of a switching amplifier. A class-D amplifier amplifies a signal having two values of logic "1" or logic "−1".

The class-D amplifier has a configuration in which two switch elements a and b are connected in series between a power source and a ground (GND). Complementary pulse signals S1 and S2 are input, as on-off control signals, to the two switch elements a and b, and only one of the switch elements a and b is controlled to be in an on-state. When the power-source-side switch element a is on and the ground-side switch element b is off, voltage (a high level, logic "1") equal to power source voltage is output from the class-D amplifier. On the contrary, when the switch element a is off and the switch element b is on, voltage (a low level, logic "−1") equal to ground potential is output from the class-D amplifier.

The class-D amplifier does not need bias current, and ideally has zero power loss. The switch elements a and b can be configured with a field effect transistor and a bipolar transistor.

FIG. 15 illustrates a configuration of a transmitter disclosed in NPL 1, in which a binary digital signal generator for converting a baseband signal into a binary digital signal is combined with a class-D amplifier. The binary digital signal generator delta-sigma-modulates each of in-phase/quadrature (I/Q) signals which are quadrature signals generated by a digital baseband generator, and further converts the signals into a radio-frequency (RF)-band binary digital signal by a digital up converter.

As an example of a delta-sigma modulator, a circuit block diagram of a primary delta-sigma modulator is illustrated in FIG. 16. After being amplified by the class-D amplifier, the binary digital signal is emitted from an antenna via a bandpass filter.

FIG. 17 illustrates a configuration of another transmitter using a class-D amplifier, disclosed in PTL 1. The transmitter in FIG. 17 converts an I-signal and a Q-signal which are input signals generated by a digital baseband generator into an amplitude signal r and a phase signal θ by an amplitude-phase converter. In a binary digital signal generator, the amplitude signal r is delta-sigma-modulated, and thus converted into a binary digital signal. The phase signal θ is up-converted by an up converter onto an RF band with a carrier frequency from an oscillator, and converted into an RF-band phase signal by a quantizer. Further, the binary digital signal is multiplied by the RF-band phase signal in a multiplier, and a RF-band binary digital signal is thus generated. After being amplified by the class-D amplifier, the binary digital signal is emitted from an antenna via a bandpass filter.

A method of improving a signal-to-noise ratio and power efficiency of the binary digital signal after the class-D amplifier in FIGS. 15 and 17 is disclosed in NPL 2. FIG. 18 illustrates a configuration of still another transmitter using a class-D amplifier, disclosed in NPL 2. The transmitter in FIG. 18 includes two sets of binary digital signal generators and class-D amplifiers. Amplitude signals r1 and r2 generated by a digital signal processor (DSP) in response to an amplitude signal r, and a phase signal θ are generated as RF-band binary digital signals by the binary digital signal generators, respectively. Because outputs of the two class-D amplifiers take two values of "1" and "4", respectively, a sum of outputs of the two class-D amplifiers is a ternary digital signal of "2", "0", and "−2". The ternary digital signal is emitted from an antenna via a bandpass filter.

The ternary digital signal after the class-D amplifier in FIG. 18 has reduced quantization noise of the signal and a higher signal-to-noise ratio, as compared with the binary digital signal after the class-D amplifier in FIGS. 15 and 17. This is because a digital signal includes a desired signal and quantization noise, and a quantization noise component is reduced by multivalue conversion. Moreover, power efficiency also becomes higher because of reduction of the noise component.

Note that, in FIGS. 15, 17, and 18, illustration, a driver amplifier is omitted. The amplifier receives a binary digital signal generated by the binary digital signal generator and then inputs the binary digital signal and a complementary signal thereof to the class-D amplifier.

CITATION LIST

Patent Literature

[PTL 1] Japanese Patent No. 5360232

Non Patent Literature

[NPL 1] A. Frappe, B. Stefanelli, A. Flament, A. Kaiser and A. Cathelin, "A digital ΔΣ RF signal generator for mobile communication transmitters in 90 nm CMOS", IEEE RFIC Symp., pp. 13-16, June 2008.

[NPL 2] K. Motoi, A. Wentzel, M. Tanio, S. Hori, M. Hayakawa, W. Heimich, and K. Kunihiro, "Digital Doherty Transmitter with Envelope ΔΣ Modulated Class-D GaN Power Amplifier for 800 MHz band", IEEE MIT-S Int. Microwave Symp. (IMS) Dig., 4 pages, June 2013.

SUMMARY OF INVENTION

Technical Problem

The ternary digital signal after the class-D amplifier in FIG. 18 has a higher signal-to-noise ratio and higher power efficiency, as compared with the binary digital signal after the class-D amplifier in FIGS. 15 and 17. On the other hand, in order to independently drive the two class-D amplifiers, the transmitter in FIG. 18 needs two signal lines which link the binary digital signal generators and the class-D amplifiers. As a result, the number of wires increases. This causes a problem that wiring in the device becomes complicated particularly in the case of a multi-antenna device. Because the multi-antenna device which has a plurality of antenna elements and a plurality of transmitters provided for respective antennas needs signal lines double as many as the antenna elements.

The present invention has been made in view of the above problem. An object of the present invention is to provide a transmitter having high signal-to-noise ratio of a transmitting signal and high power efficiency. Another object of the invention is to suppress a complication of wiring in the transmitter. The transmitter has a signal generation unit for generating a binary digital signal in an amplification process and an amplification unit for amplifying the binary digital signal and wires linking the units.

Solution to Problem

A transmitter according to the present invention includes: a signal generation unit which generates a binary digital signal; and an amplification unit including a signal processor which generates a K-value digital signal (K is an integer greater than or equal to 3) from the binary digital signal and generates a plurality of binary digital signals from the K-value digital signal, a plurality of amplifiers which amplify the plurality of binary digital signals, respectively, and a combiner which combines the plurality of amplified binary digital signals, and thus generates a combined signal having an approximately proportional relationship with the K-value digital signal.

A transmission method according to the present invention includes: generating a binary digital signal; generating a K-value digital signal (K is an integer greater than or equal to 3) from the binary digital signal; generating a plurality of binary digital signals from the K-value digital signal; amplifying the plurality of binary digital signals, respectively; and combining the plurality of amplified binary digital signals, and thus generating a combined signal having an approximately proportional relationship with the K-value digital signal.

A multi-antenna device according to the present invention includes a plurality of transmitters, each of the plurality of transmitters including: a signal generation unit which generates a binary digital signal; and an amplification unit including a signal processor which generates a K-value digital signal (K is an integer greater than or equal to 3) from the binary digital signal and generates a plurality of binary digital signals from the K-value digital signal, a plurality of amplifiers which amplify the plurality of binary digital signals, respectively, and a combiner which combines the plurality of amplified binary digital signals, and thus generates a combined signal having an approximately proportional relationship with the K-value digital signal.

Advantageous Effects of Invention

According to the present invention, it is possible to provide a transmitter having high signal-to-noise ratio of a transmitting signal and high power efficiency. It is also possible to provide a transmitter whose complication of wiring is suppressed. The wiring links a signal generation unit for generating a binary digital signal in an amplification process and an amplification unit for amplifying the binary digital signal.

BRIEF DESCRIPTION OF DRAWINGS

FIG. 11 is a diagram illustrating an output signal of each component of the signal processor in FIG. 10 of the amplification unit of the transmitter according to the second example embodiment of the present invention.

FIG. 12 is a diagram illustrating an output signal of each component of the signal processor in FIG. 10 of the amplification unit of the transmitter according to the second example embodiment of the present invention.

FIG. 20 is a diagram illustrating an output signal of each component of the signal processor in FIG. 19 of the amplification unit of the transmitter according to the fourth example embodiment of the present invention.

FIG. 22 is a diagram illustrating an output signal of each component of the signal processor in FIG. 21 of the amplification unit of the transmitter according to the fourth example embodiment of the present invention.

EXAMPLE EMBODIMENT

Hereinafter, example embodiments of the present invention will be described in detail with reference to the drawings. However, limitations technically preferable to carry out the present invention are imposed on the example embodiments described below, but do not limit the scope of the invention to the followings.

First Example Embodiment

Figure 1:
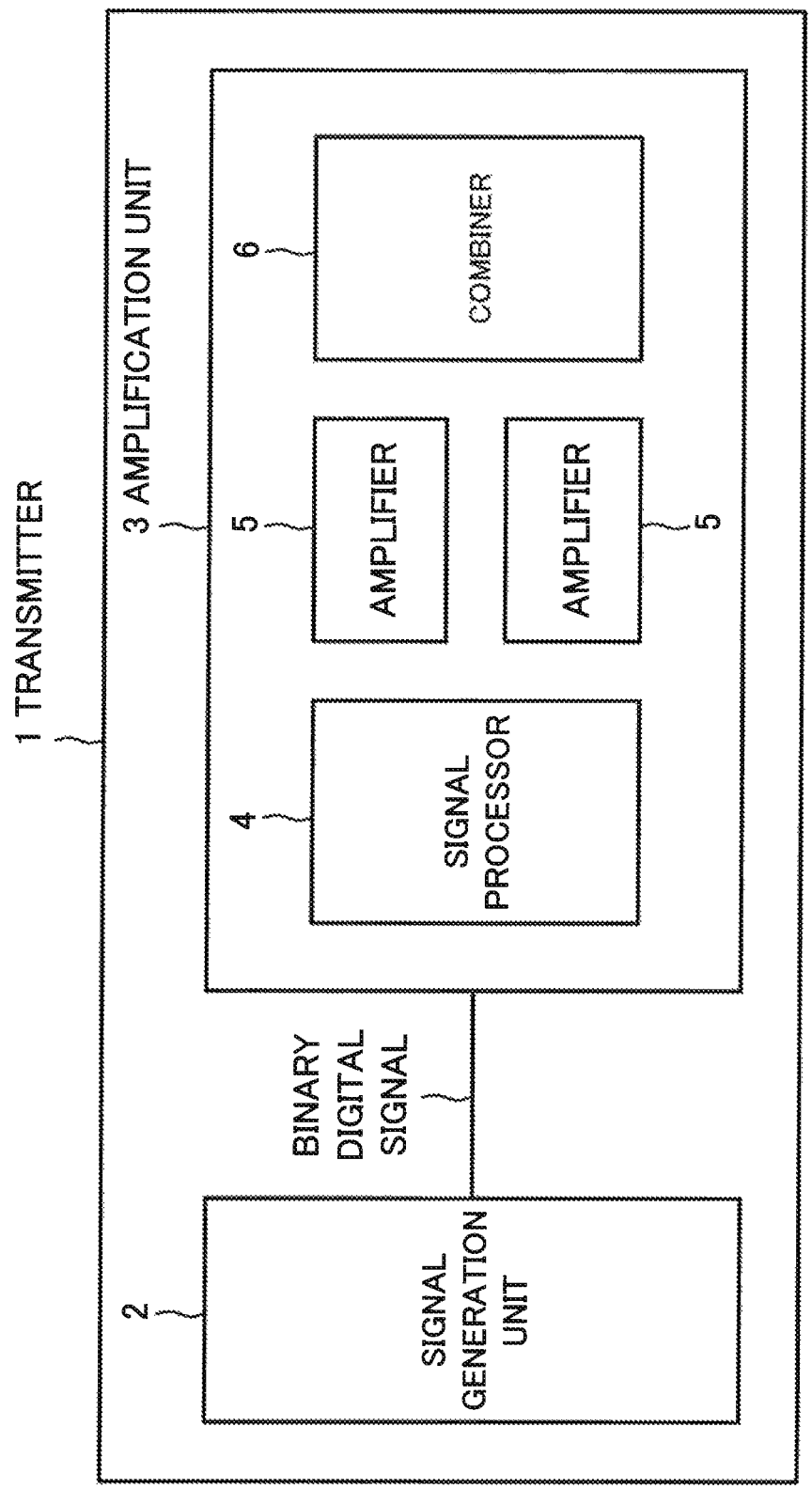
FIG. 1 is a block diagram illustrating a configuration of a transmitter according to a first example embodiment of the present invention.

FIG. 1 is a block diagram illustrating a configuration of a transmitter according to a first example embodiment of the present invention. A transmitter 1 in the present example embodiment includes a signal generation unit 2 which generates a binary digital signal, and an amplification unit 3 which amplifies the binary digital signal.

The amplification unit 3 includes a signal processor 4 which generates a K-value digital signal (K is an integer greater than or equal to 3) from the binary digital signal, and generates a plurality of binary digital signals from the K-value digital signal. The amplification unit 3 further includes a plurality of amplifiers 5 which amplify the plurality of binary digital signals, respectively, and a combiner 6 which combines the plurality of amplified binary digital signals, and thus generates a combined signal having an approximately proportional relationship with the K-value digital signal.

A transmission method in the present example embodiment includes generating a binary digital signal, and generating a K-value digital signal (K is an integer greater than or equal to 3) from the binary digital signal. The transmission method further includes generating a plurality of binary digital signals from the K-value digital signal. The transmission method further includes amplifying the plurality of binary digital signals, respectively. The transmission method further includes combining the plurality of amplified binary digital signals, and thus generating a combined signal having an approximately proportional relationship with the K-value digital signal.

According to the present example embodiment, it is possible to provide a transmitter having high signal-to-noise ratio of a transmitting signal and high power efficiency. It is also possible to provide a transmitter whose complication of wiring is suppressed. The wiring links a signal generation unit for generating a binary digital signal in an amplification process and an amplification unit for amplifying the binary digital signal.

Second Example Embodiment

Figure 2:
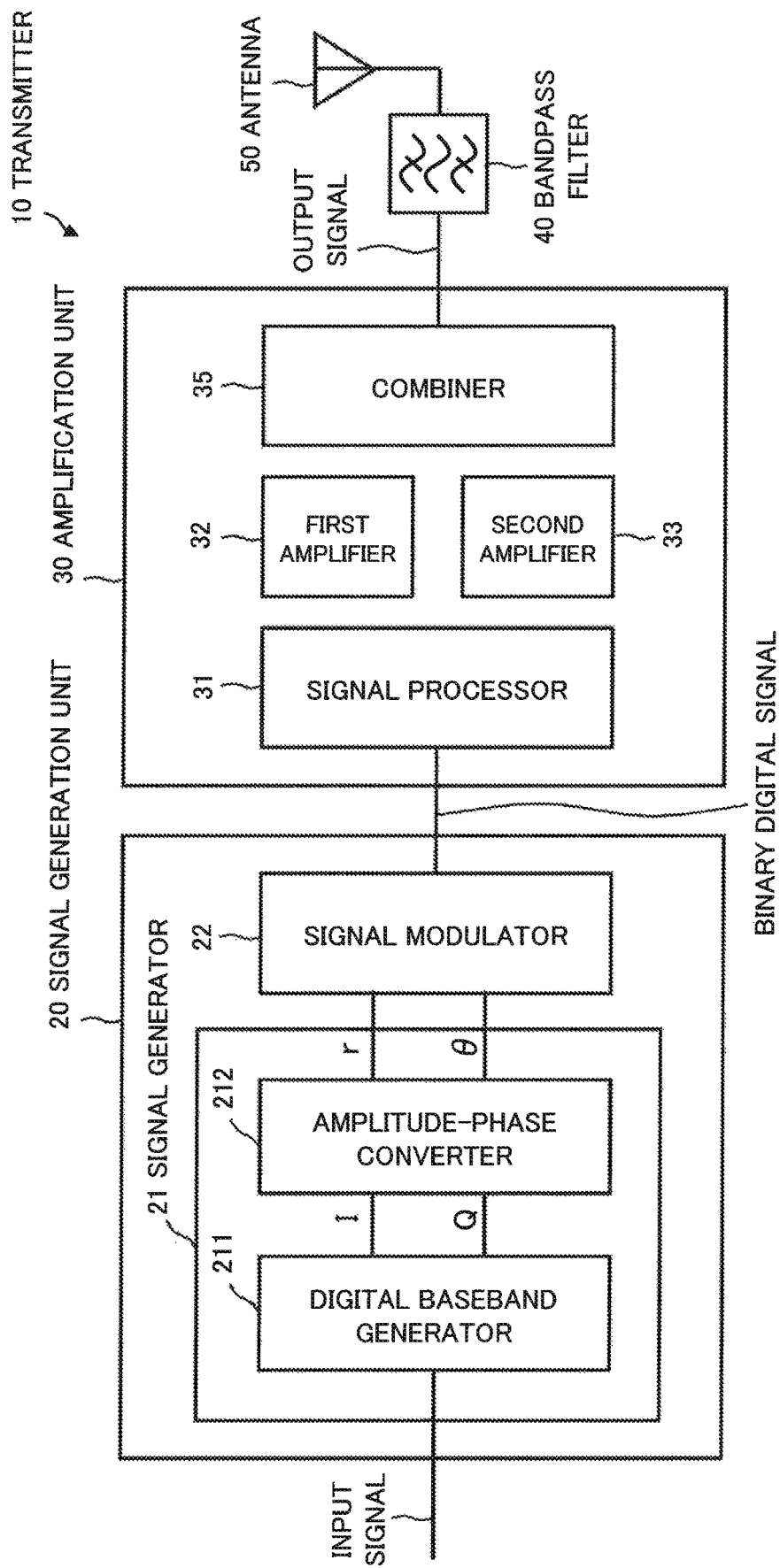
FIG. 2 is a block diagram illustrating a configuration of a transmitter according to a second example embodiment of the present invention.

FIG. 2 is a block diagram illustrating a configuration of a transmitter according to a second example embodiment of the present invention. A transmitter 10 in the present example embodiment includes a signal generation unit 20, an amplification unit 30, a bandpass filter 40, and an antenna 50.

The signal generation unit 20 includes a signal generator 21 and a signal modulator 22. The signal generator 21 includes a digital baseband generator 211 and an amplitude-phase converter 212. The digital baseband generator 211 generates an I-signal and a Q-signal, which are quadrature signals, from an input signal (desired signal) to be transmitted by the transmitter 10. The amplitude-phase converter 212 converts the I-signal and the Q-signal into an amplitude signal r and a phase signal θ.

Figure 3:
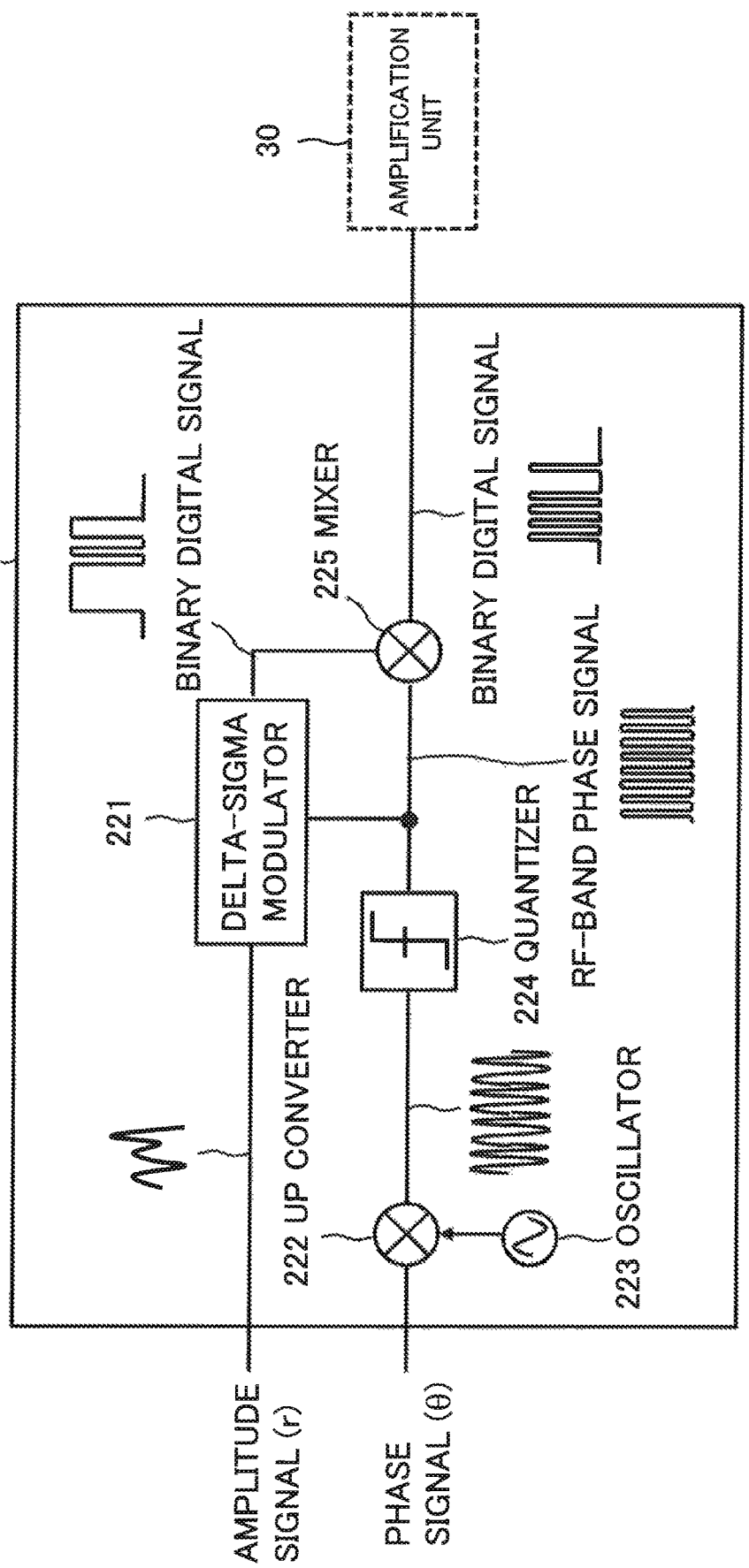
FIG. 3 is a block diagram illustrating a configuration example of a signal modulator of the transmitter according to the second example embodiment of the present invention.

FIG. 3 is a block diagram illustrating a configuration example of the signal modulator 22. A delta-sigma modulator 221 delta-sigma-modulates the amplitude signal r and thus converts the amplitude signal r into a binary digital signal. An up converter 222 up-converts the phase signal θ onto an RF band with a carrier frequency from an oscillator 223. A quantizer 224 converts the phase signal θ up-converted onto the RF band, into a quantized RF-band phase signal. A mixer 225 multiplies the binary digital signal by the RF-band phase signal, and thus generates a RF-band binary digital signal.

Figure 15:
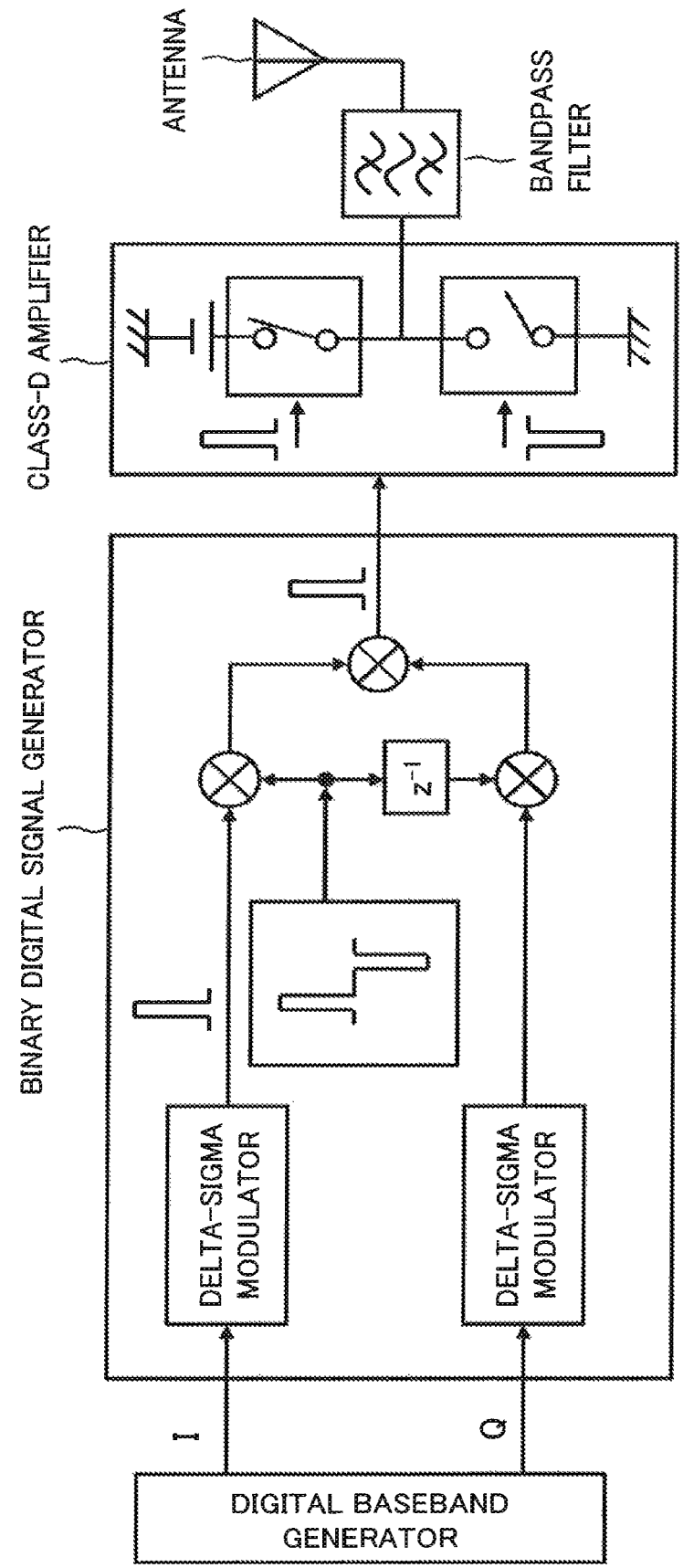
FIG. 15 is a block diagram illustrating a configuration of a transmitter disclosed in NPL 1.
Figure 16:
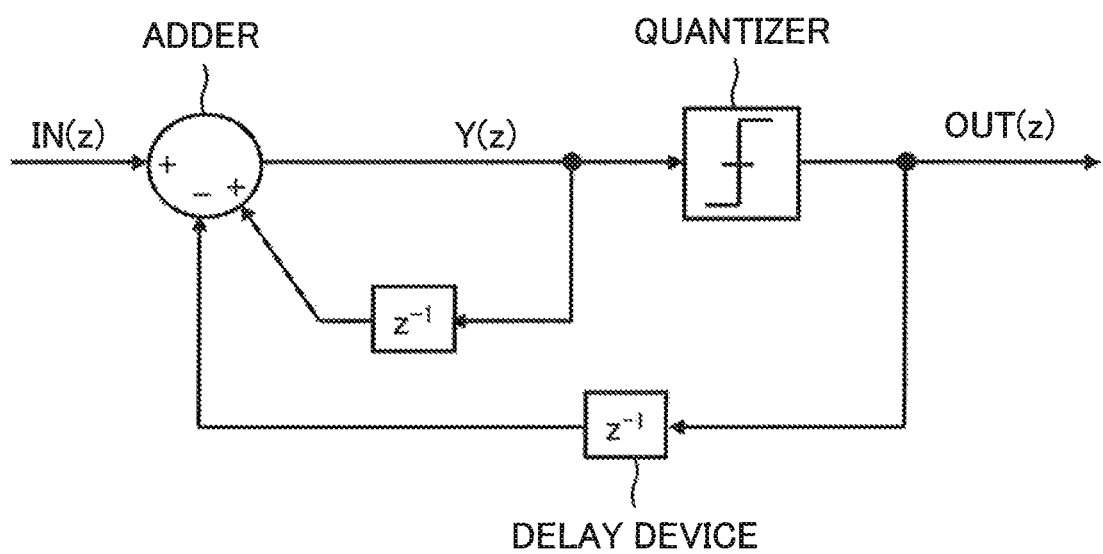
FIG. 16 is a block diagram illustrating an example of a configuration of a delta-sigma modulator.

Note that the signal modulator 22 is not limited to the configuration in FIG. 3, and can have, for example, a configuration of a binary digital signal generator illustrated in FIG. 15.

The amplification unit 30 includes a signal processor 31, a first amplifier 32, a second amplifier 33, and a combiner 35. A binary digital signal generated in the signal generation unit 20 is input to the signal processor 31, and the signal processor 31 generates binary digital signals to be input to the first amplifier 32 and the second amplifier 33, respectively. Details will be described later.

Figure 4:
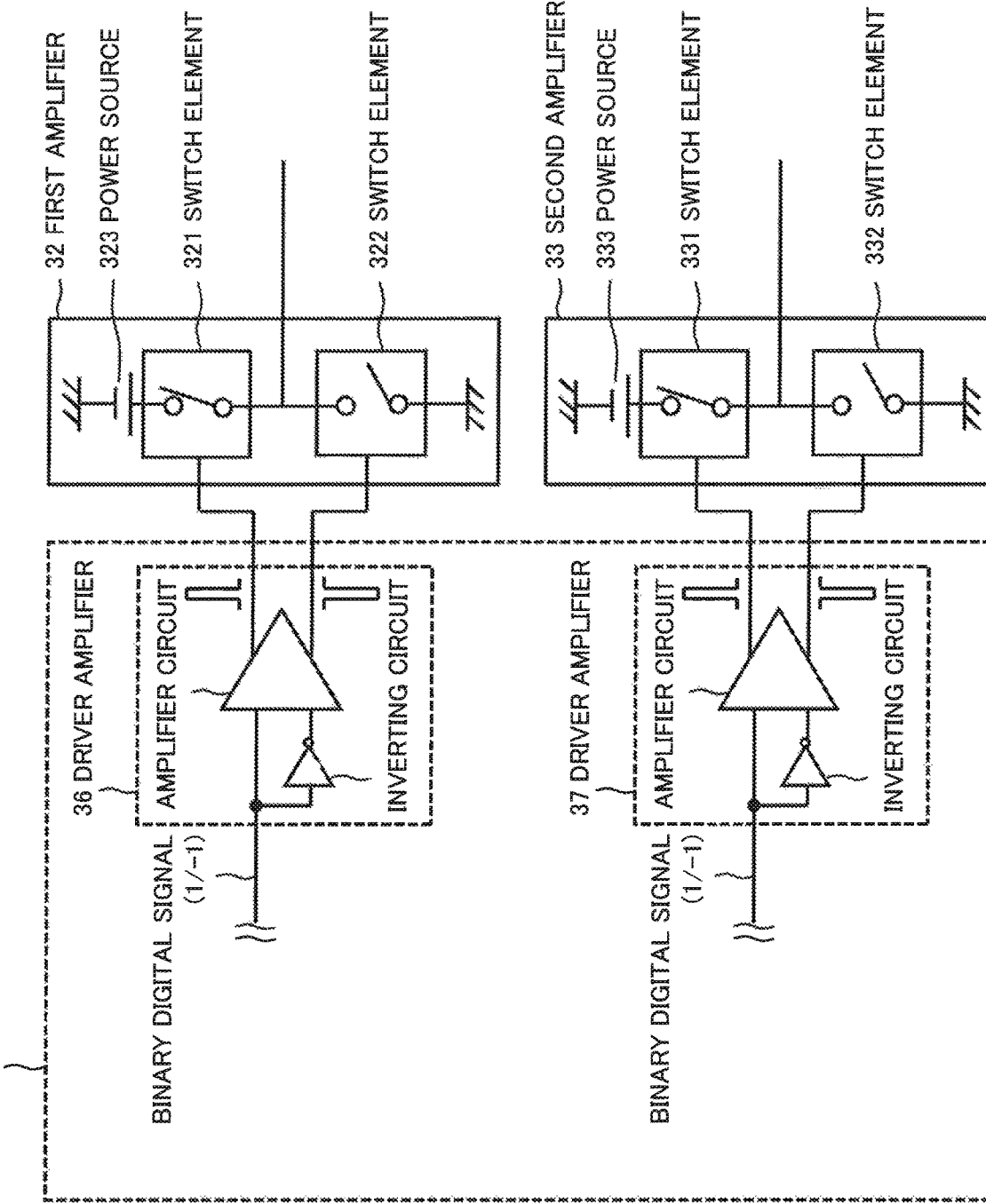
FIG. 4 is a diagram illustrating configurations of amplifiers of the transmitter according to the second example embodiment of the present invention, and a method of inputting signals to the amplifiers.

FIG. 4 is a diagram illustrating configurations of the first amplifier 32 and the second amplifier 33, and a method of inputting the binary digital signals generated in the signal processor 31 to the first amplifier 32 and the second amplifier 33, respectively. The first amplifier 32 can be a class-D amplifier including a switch element 321, a switch element 322, and a power source 323, and the second amplifier 33 can be a class-D amplifier including a switch element 331, a switch element 332, and a power source 333, respectively.

A driver amplifier 36 and a driver amplifier 37 each include an inverting circuit and an amplifier circuit. The amplifier circuit can also have a multistage configuration including a plurality of amplifier circuits. The driver amplifier 36 amplifies the binary digital signal generated in the signal processor 31 and its complementary signal (inversion signal) for the first amplifier 32, and inputs each of the signals to the first amplifier 32. The driver amplifier 37 amplifies the binary digital signal generated in the signal processor 31 and its complementary signal (inversion signal) for the second amplifier 33, and inputs each of the signals to the second amplifier 33. Note that the driver amplifiers 36 and 37 can be provided in the signal processor 31 as illustrated in FIG. 4, and can also be independently provided between the signal processor 31 and the amplifiers.

The combiner 35 adds together the binary digital signals amplified in the first amplifier 32 and the second amplifier 33, and outputs the signals as a combined signal.

The bandpass filter 40 has a pass band on a frequency band including a desired signal (an input signal input to the digital baseband generator 211) that is desired to be transmitted by the transmitter. When the combined signal of the combiner 35 is input to the bandpass filter 40, a desired signal component passes through the bandpass filter 40, and a quantization noise component outside of the pass band is reduced. The desired signal component which has passed through the bandpass filter 40 is a signal in which the desired signal input to the digital baseband generator 211 is converted to a high frequency band and then restored in an amplified state.

The antenna 50 emits, into air, the desired signal component, which has passed through the bandpass filter 40, of the combined signal.

Figure 5:
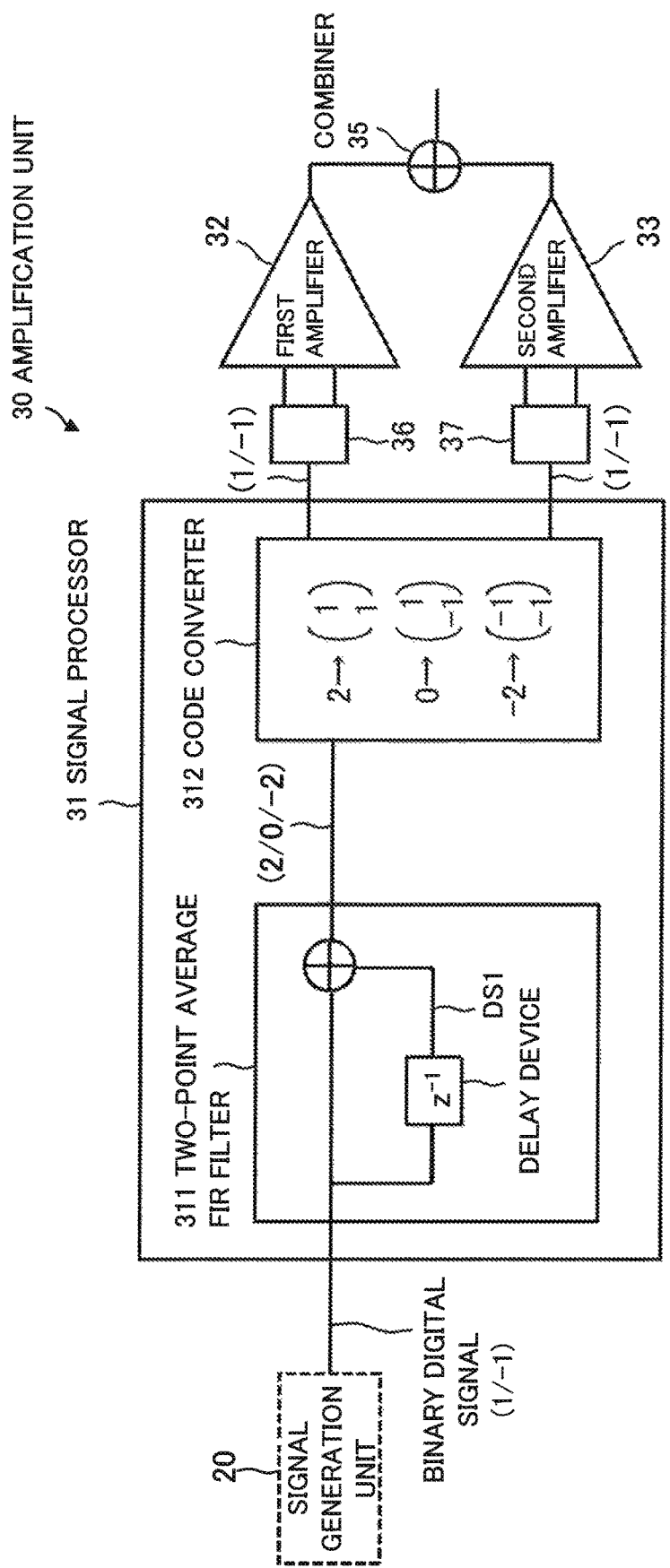
FIG. 5 is a block diagram illustrating configurations of a signal processor and amplifiers of an amplification unit of the transmitter according to the second example embodiment of the present invention.

FIG. 5 is a block diagram illustrating configurations of the signal processor 31 and amplifiers of the amplification unit 30. The signal processor 31 includes a two-point average finite impulse response (FIR) filter 311 which is a digital filter, and a code converter 312.

The two-point average FIR filter 311 outputs a sum of a binary digital signal which is an input signal, and a delay signal (DS1) in which the input signal is delayed one clock by a delay device. In this instance, because the binary digital signal which is the input signal takes two values of "1" and "−1", the delay signal DS1 also takes two values of "1" and "−1". As a result, an output of the two-point average FIR filter 311 takes three values of "2", "0", and "−2".

The code converter 312 generates binary signals to be input to the first amplifier 32 and the second amplifier 33, from the ternary output of the two-point average FIR filter 311. Specifically, when an input is "2", the code converter 312 outputs "1" to the first amplifier 32, and "1" to the second amplifier 33. By equally setting voltage amplification factors of the first amplifier 32 and the second amplifier 33 to "G1", an output after combining in the combiner 35 becomes 2×G1. In other words, an output after combining in the combiner 35 becomes a signal in which an output "2" of the two-point average FIR filter 311 is amplified by the voltage amplification factor G1.

Then, when an input is "0", the code converter 312 outputs "1" to the first amplifier 32, and "−1" to the second amplifier 33. In this case, an output after combining in the combiner 35 is 0. In other words, an output after combining in the combiner 35 is a signal in which an output "0" of the two-point average FIR filter 311 is amplified by the voltage amplification factor G1. Note that the code converter 312 may output "−1" to the first amplifier 32, and output "1" to the second amplifier 33, and an output then becomes 0.

Finally, when an input is "−2", the code converter 312 outputs "−1" to the first amplifier 32, and "−1" to the second amplifier 33. In this case, an output after combining in the combiner 35 is −2×G1. In other words, an output after combining in the combiner 35 is a signal in which an output "−2" of the two-point average FIR filter 311 is amplified by the voltage amplification factor G1.

As described above, the code converter 312 converts an output of the two-point average FIR filter 311, and then inputs the converted output to the first amplifier 32 and the second amplifier 33. Thereby, a combined signal combined by the combiner 35 after amplification has a proportional relationship, in which the voltage amplification factor G1 is a proportionality factor, with a ternary digital signal of an output signal of the two-point average FIR filter 311. In other words, the amplification unit 30 is capable of amplifying a ternary digital signal which has been converted into a ternary form by the two-point average FIR filter 311 and reduced in quantization noise, and can therefore generate a combined signal reduced in quantization noise.

Figure 6:
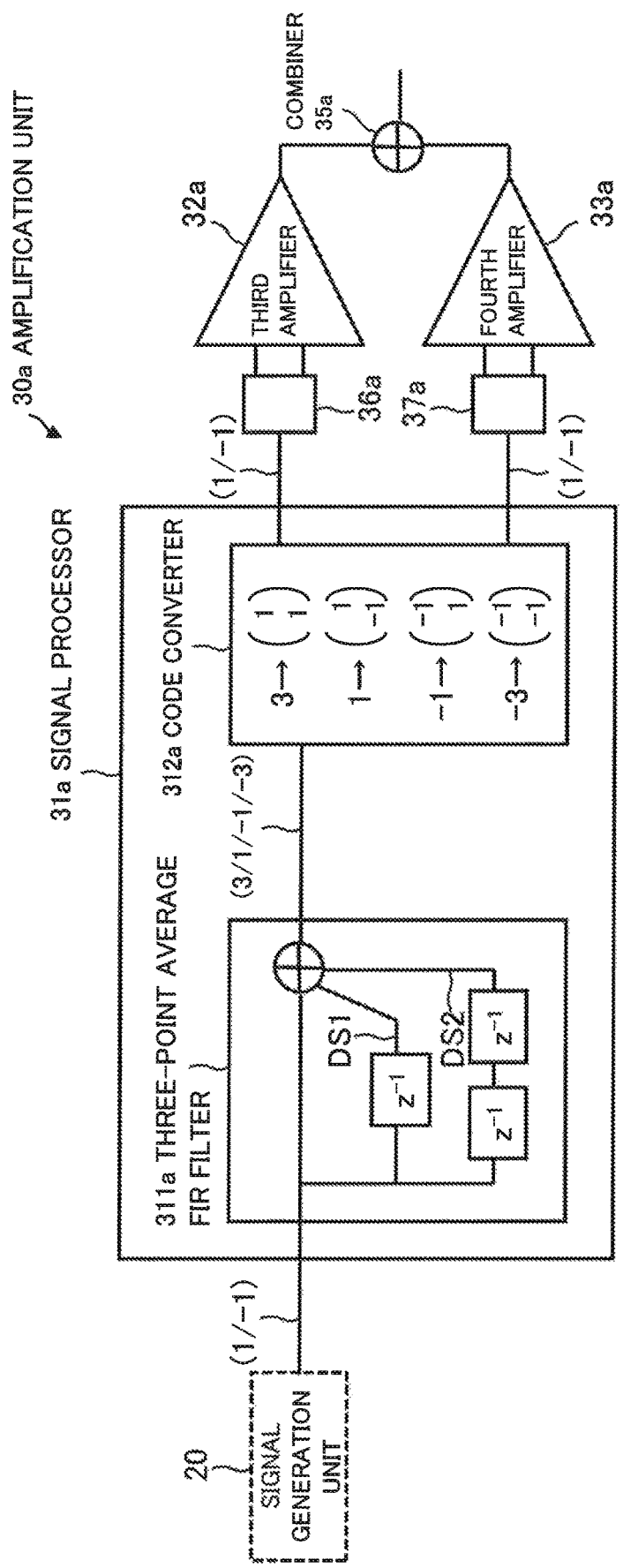
FIG. 6 is a block diagram illustrating configurations of a signal processor and amplifiers of an amplification unit of the transmitter according to the second example embodiment of the present invention.

FIG. 6 is a block diagram illustrating alternative configurations of a signal processor and amplifiers of an amplification unit of the transmitter 10. An amplification unit 30a includes a signal processor 31a, a driver amplifier 36a, a driver amplifier 37a, a third amplifier 32a, a fourth amplifier 33a, and a combiner 35a.

The signal processor 31a includes a three-point average FIR filter 311a which is a digital filter, and a code converter 312a. The third amplifier 32a and the fourth amplifier 33a are class-D amplifiers. The third amplifier 32a has a voltage amplification factor 2×G2, and the fourth amplifier 33a has a voltage amplification factor G2, respectively. In other words, the voltage amplification factor of the third amplifier 32a is set double the voltage amplification factor of the fourth amplifier 33a.

Figure 7:
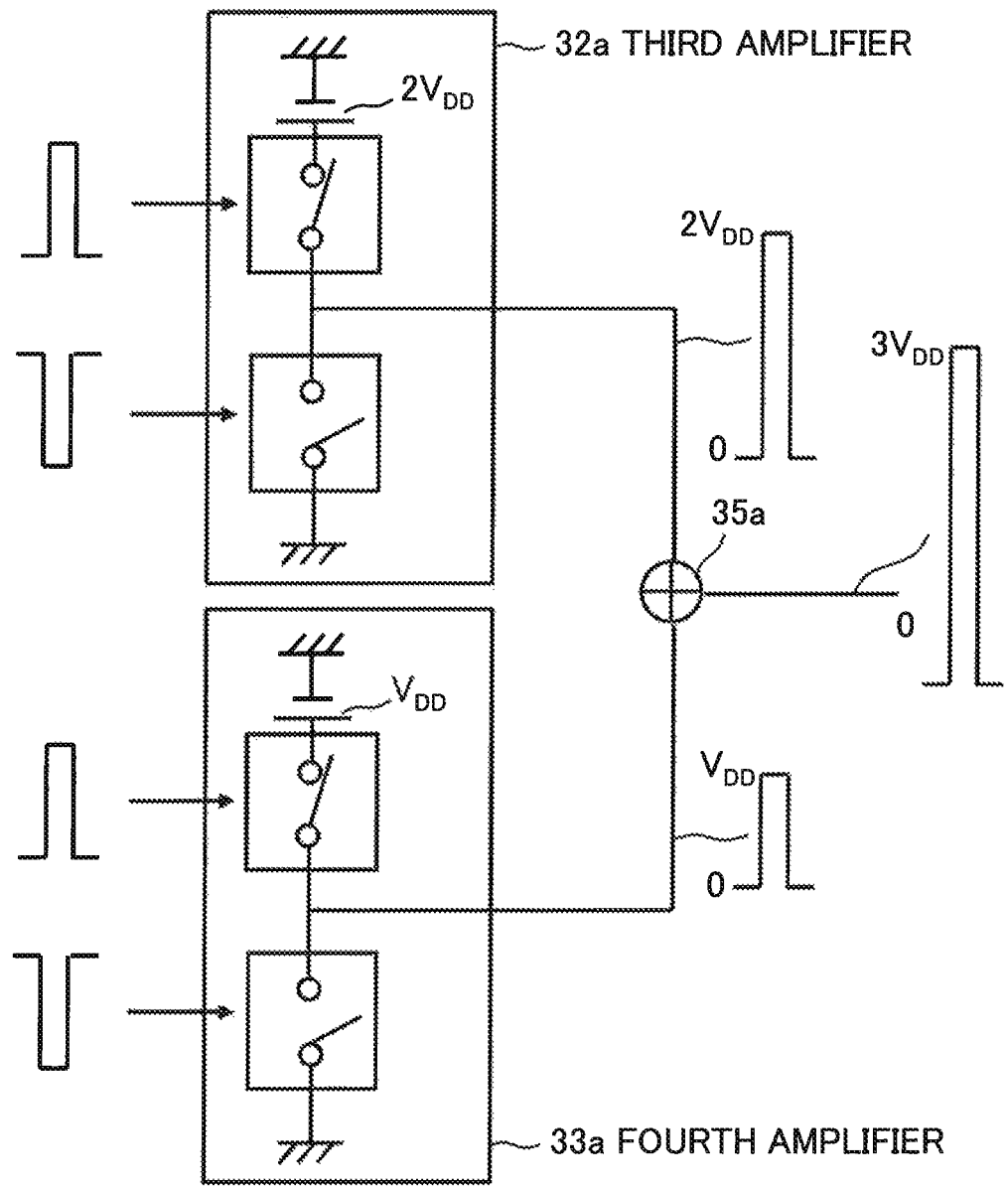
FIG. 7 is a diagram illustrating configuration examples and operations of the amplifiers of the transmitter according to the second example embodiment of the present invention.

FIG. 7 is a diagram illustrating configuration examples and operations of the third amplifier 32a and the fourth amplifier 33a. Drive voltage (2VDD) of the third amplifier 32a is set double drive voltage (VDD) of the fourth amplifier 33a. Thereby, output voltage of the third amplifier 32a becomes double output voltage of the fourth amplifier 33a, and the voltage amplification factor of the third amplifier 32a can be double the voltage amplification factor of the fourth amplifier 33a. Further, output voltage after combining in the combiner 35a becomes 3VDD.

Figure 8:
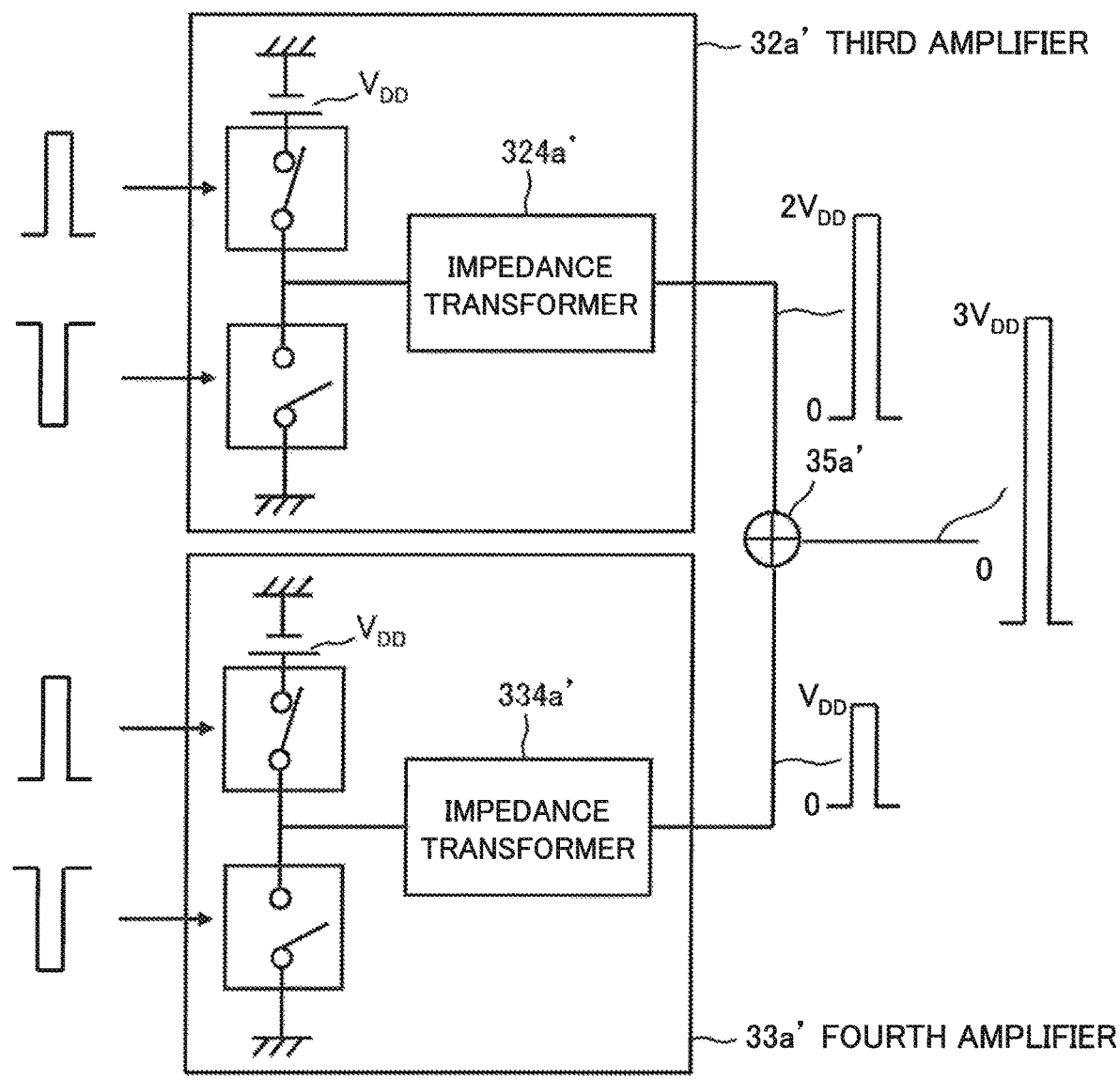
FIG. 8 is a diagram illustrating configuration examples and operations of amplifiers of the transmitter according to the second example embodiment of the present invention.

FIG. 8 is a diagram illustrating alternative configuration examples and operations of a third amplifier and a fourth amplifier. A third amplifier 32a' and a fourth amplifier 33a' include an impedance transformer 324a' and an impedance transformer 334a' that are each connected to a class-D amplifier and its subsequent stage. Drive voltages (VDD) of the class-D amplifiers of the third amplifier 32a' and the fourth amplifier 33a' are equal. On the other hand, a conversion rate of the impedance transformer 324a' is set four times a conversion rate of the impedance transformer 334a'. Thereby, output power of the third amplifier 32a' is four times that of the fourth amplifier 33a', and is double when converted into voltage. Further, output voltage after combining in a combiner 35a' is 3VDD.

In the signal processor 31a in FIG. 6, the three-point average FIR filter 311a outputs a sum of a binary digital signal which is an input signal, a delay signal (DS1) in which the input signal is delayed one clock by a delay device, and a delay signal (DS2) in which the input signal is delayed two clocks. Because the binary digital signal which is the input signal takes two values of "1" and "−1", the delay signals DS1 and DS2 also take two values of "1" and "−1". As a result, an output of the three-point average FIR filter 311a takes four values of "3", "1", "−1", and "−3".

The code converter 312a generates a binary signal to be input to the third amplifier 32a and the fourth amplifier 33a, from the four-value output of the three-point average FIR filter 311a. Specifically, when an input is "3", the code converter 312a outputs "1" to the third amplifier 32a, and "1" to the fourth amplifier 33a. In this case, the voltage amplification factor of the third amplifier 32a is 2×G2, the voltage amplification factor of the fourth amplifier 33a is G2, and thus an output after combining in the combiner 35a is 3×G2. In other words, an output after combining in the combiner 35a is a signal in which an output "3" of the three-point average FIR filter 311a is amplified by the voltage amplification factor G2.

Then, when an input is "1", the code converter 312a outputs "1" to the third amplifier 32a, and "−1" to the fourth amplifier 33a. In this case, an output after combining in the combiner 35a is G2. In other words, an output after combining in the combiner 35a is a signal in which an output "1" of the three-point average FIR filter 311a is amplified by the voltage amplification factor G2.

Then, when an input is "−1", the code converter 312a outputs "−1" to the third amplifier 32a, and "1" to the fourth amplifier 33a. In this case, an output after combining in the combiner 35a is −G2. In other words, an output after combining in the combiner 35a is a signal in which an output "−1" of the three-point average FIR filter 311a is amplified by the voltage amplification factor G2.

Finally, when an input is "−3", the code converter 312a outputs "−1" to the third amplifier 32a, and "−1" to the fourth amplifier 33a. In this case, an output after combining in the combiner 35a is −3×G2. In other words, an output after combining in the combiner 35a is a signal in which an output "−3" of the three-point average FIR filter 311a is amplified by the voltage amplification factor G2.

As described above, the code converter 312a converts an output of the three-point average FIR filter 311a, and then inputs the converted output to the third amplifier 32a and the fourth amplifier 33a. Thereby, a combined signal combined by the combiner 35a after amplification has a proportional relationship, in which the voltage amplification factor G2 is a proportionality factor, with a four-value digital signal of an output signal of the three-point average FIR filter 311a. In other words, the amplification unit 30a is capable of amplifying a four-value digital signal which has been converted into a four-value form by the three-point average FIR filter 311a and reduced in quantization noise, and can therefore generate a combined signal reduced in quantization noise.

Figure 9:
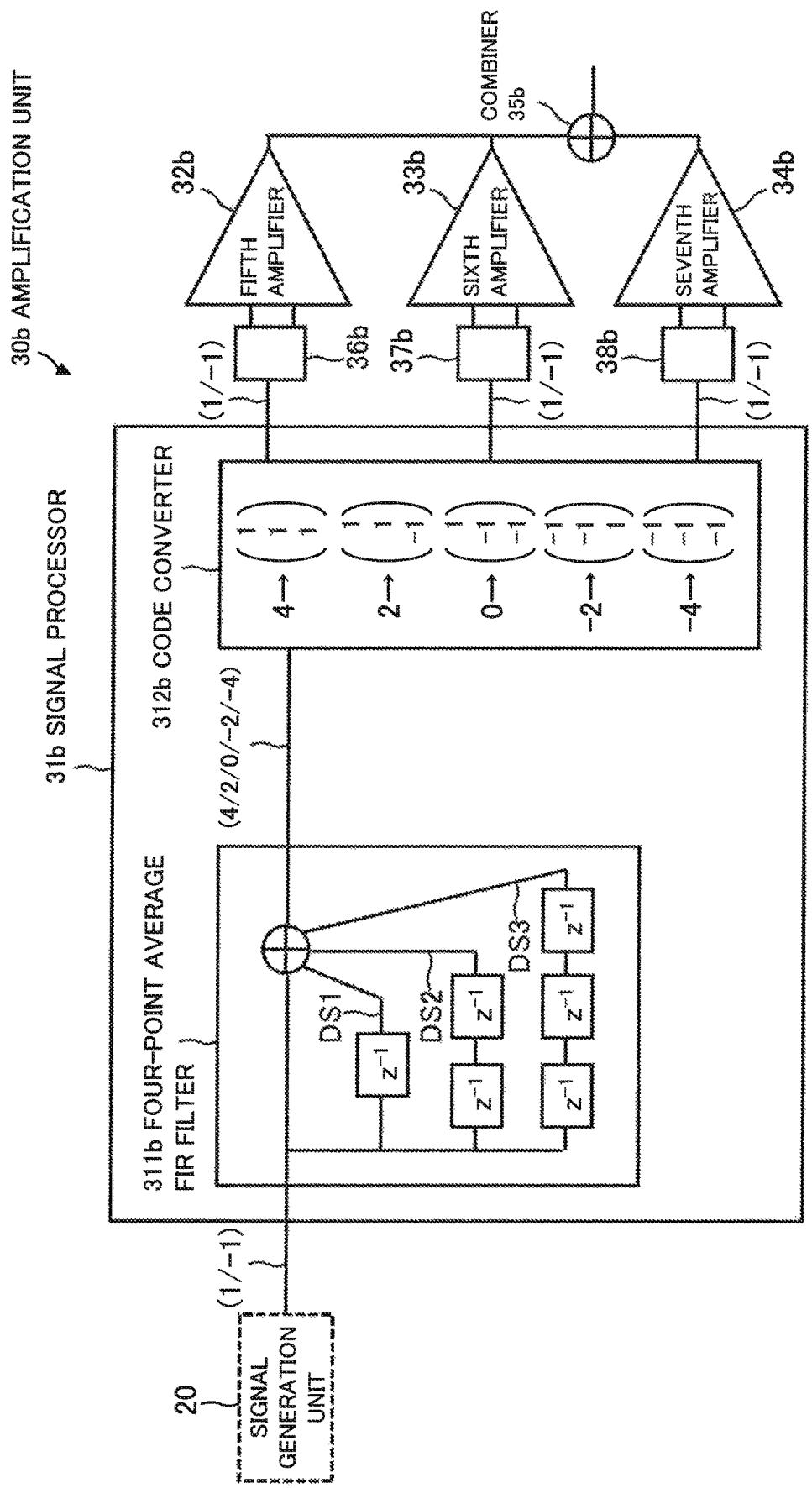
FIG. 9 is a block diagram illustrating configurations of a signal processor and amplifiers of an amplification unit of the transmitter according to the second example embodiment of the present invention.

FIG. 9 is a block diagram illustrating further alternative configurations of a signal processor and amplifiers of an amplification unit of the transmitter 10. An amplification unit 30b includes a signal processor 31b, a driver amplifier 36b, a driver amplifier 37b, a driver amplifier 38b, a fifth amplifier 32b, a sixth amplifier 33b, a seventh amplifier 34b, and a combiner 35b.

The signal processor 31b includes a four-point average FIR filter 311b which is a digital filter, and a code converter 312b. The fifth amplifier 32b, the sixth amplifier 33b, and the seventh amplifier 34b are class-D amplifiers. The fifth amplifier 32b has a voltage amplification factor 2×G3, the sixth amplifier 33b has a voltage amplification factor G3, and the seventh amplifier 34b has a voltage amplification factor G3, respectively. In other words, the voltage amplification factor of the fifth amplifier 32b is set double the voltage amplification factors of the sixth amplifier 33b and the seventh amplifier 34b.

The four-point average FIR filter 311b outputs a sum of a binary digital signal which is an input signal, a delay signal (DS1) in which the input signal is delayed one clock by a delay device, a delay signal (DS2) in which the input signal is delayed two clocks, and a delay signal (DS3) in which the input signal is delayed three clocks. In this instance, because the binary digital signal which is the input signal takes two values of "1" and "−1", the delay signals DS1, DS2, and DS3 also take two values of "1" and "−1". As a result, an output of the four-point average FIR filter 311b takes five values of "4", "2", "0", "−2", and "−4".

The code converter 312b generates a binary signal to be input to the fifth amplifier 32b, the sixth amplifier 33b, and the seventh amplifier 34b, from the five-value output of the four-point average FIR filter 311b. Specifically, when an input is "4", the code converter 312b outputs "1" to the fifth amplifier 32b, "1" to the sixth amplifier 33b, and "1" to the seventh amplifier 33b. In this case, the voltage amplification factor of the fifth amplifier 32b is 2×G3, the voltage amplification factor of the sixth amplifier 33b is G3, the voltage amplification factor of the seventh amplifier 34b is G3, and thus an output after combining in the combiner 35b is 4×G3. In other words, an output after combining in the combiner 35b is a signal in which an output "4" of the four-point average FIR filter 311b is amplified by the voltage amplification factor G3.

Then, when an input is "2", the code converter 312b outputs "1" to the fifth amplifier 32b, "1" to the sixth amplifier 33b, and "−1" to the seventh amplifier 33b. In this case, an output after combining in the combiner 35b is 2×G3. In other words, an output after combining in the combiner 35b is a signal in which an output "2" of the four-point average FIR filter 311b is amplified by the voltage amplification factor G3.

Then, when an input is "0", the code converter 312b outputs "1" to the fifth amplifier 32b, "−1" to the sixth amplifier 33b, and "−1" to the seventh amplifier 33b. In this case, an output after combining in the combiner 35b is 0×G3. In other words, an output after combining in the combiner 35b is a signal in which an output "0" of the four-point average FIR filter 311b is amplified by the voltage amplification factor G3.

Then, when an input is "−2", the code converter 312b outputs "−1" to the fifth amplifier 32b, "−1" to the sixth amplifier 33b, and "1" to the seventh amplifier 33b. In this case, an output after combining in the combiner 35b is −2×G3. In other words, an output after combining in the combiner 35b is a signal in which an output "−2" of the four-point average FIR filter 311b is amplified by the voltage amplification factor G3.

Finally, when an input is "−4", the code converter 312b outputs "−1" to the fifth amplifier 32b, "−1" to the sixth amplifier 33b, and "−1" to the seventh amplifier 33b. In this case, an output after combining in the combiner 35b is −4×G3. In other words, an output after combining in the combiner 35b is a signal in which an output "−4" of the four-point average FIR filter 311b is amplified by the voltage amplification factor G3.

As described above, the code converter 312b converts an output of the four-point average FIR filter 311b, and then inputs the converted output to the fifth amplifier 32b, the sixth amplifier 33b, and the seventh amplifier 34b. Thereby, a combined signal combined by the combiner 35b after amplification has a proportional relationship, in which the voltage amplification factor G3 is a proportionality factor, with a five-value digital signal of an output signal of the four-point average FIR filter 311b. In other words, the amplification unit 30b is capable of amplifying a five-value digital signal which has been converted into a five-value form by the four-point average FIR filter 311b and reduced in quantization noise, and can therefore generate a combined signal reduced in quantization noise.

Note that the filter used for the signal processor 31 is not limited to a two-point average FIR filter, a three-point average FIR filter, and a four-point average FIR filter. Even with a filter other than the above filters, it is possible to provide a code converter having a conversion rule corresponding to an output of the filter, and suitably set the number of amplifiers and an amplification factor.

Figure 10:
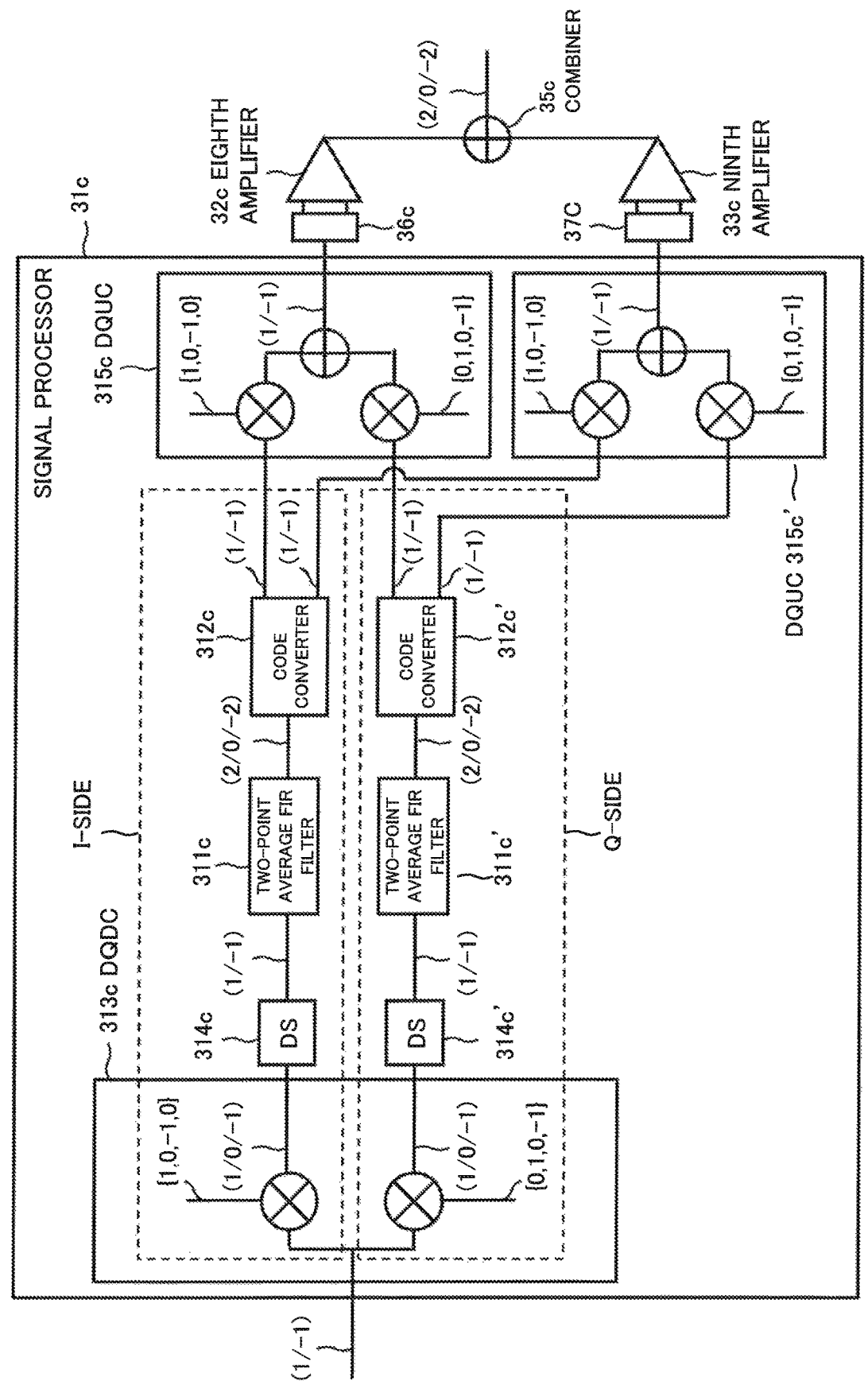
FIG. 10 is a block diagram illustrating configurations of a signal processor and an amplifier 5 of an amplification unit of the transmitter according to the second example embodiment of the present invention.

FIG. 10 is a block diagram illustrating further alternative configurations of a signal processor and amplifiers of an amplification unit of the transmitter 10. An amplification unit 30c includes a signal processor 31c, a driver amplifier 36c, a driver amplifier 37c, an eighth amplifier 32c, a ninth amplifier 33c, and a combiner 35c. It is assumed that voltage amplification factors of the eighth amplifier 32c and the ninth amplifier 33c are the same.

The signal processor 31c includes a digital quadrature down converter (DQDC) 313c, and down-samplers (DS) 314c and 314c'. The signal processor 31c further includes two-point average FIR filters 311c and 311c', code converters 312c and 312c', and digital quadrature up converters (DQUC) 315c and 315c'.

FIG. 11 is a diagram illustrating signals of components (an input signal, the DQCQ, and the DS) of the signal processor 31c. FIG. 12 is a diagram illustrating signals of components (the two-point average FIR filters, the code converters, and the DQUC) of the signal processor 31c.

The signal processor 31c assumes, as an input signal, a binary digital signal generated by the signal generation unit 20. The DQDC 313c quadrature-demodulates the binary digital signal, and generates two baseband quadrature digital signals (an I-signal and a Q-signal). Repetitive signals which are {1, 0, −1, 0} on an I-side and {0, 1, 0, −1} on a Q-side and which are π/4 phases different from each other are used for digital local signals to be input to the DQDC 313c as local signals.

When data of an input signal are {d1, d2, d3, ... } in a time-series order, baseband digital signals are {d1, 0, −d3, 0, d5, 0, −d7, ... } on an I-side, and {0, d2, 0, −d4, 0, d6, 0, −d8 ... } on a Q-side, thus alternately having data and zeros, as illustrated in FIG. 11. d1, d2, and the like are binary data of 1 or −1. Each of the DSs 314c and 314c' down-samples the I-side and Q-side baseband digital signals in such a manner as to exclude zeros. As a result, the I-side and Q-side baseband digital signals become {d1, −d3, d5, −d7, ... } and {d2, −d4, d6, −d8, ... }, respectively.

Each of the baseband digital signals is a binary digital signal, but is converted into a ternary (2/0/−2) digital signal by the two-point average FIR filters 311c and 311c' provided on the I-side and the Q-side, respectively. In other words, an output of the I-side two-point average FIR filters 311c is {I1, I2, I3, ... }, and an output of the Q-side two-point average FIR filters 311c' is {Q1, Q2, Q3, ... }. I1, d2, Q1, Q2, and the like are 2 or 0 or −2.

Each ternary digital signal is converted into a binary digital signal (1/−1) for the eighth amplifier 32c and the ninth amplifier 33c by the code converters 312c and 312c' provided on the I-side and the Q-side, respectively.

Operations of the code converters 312c and 312c' are similar to the operation of the code converter 312 illustrated in FIG. 5. In other words, when a value of a ternary digital signal which is an input signal is "2", "1" is output to the eighth amplifier 32c, and "1" is output to the ninth amplifier 33c. When a value of a ternary digital signal is "0", "1" is output to the eighth amplifier 32c, and "−1" is output to the ninth amplifier 33c. When a value of a ternary digital signal is "−2", "−1" is output to the eighth amplifier 32c, and "−1" is output to the ninth amplifier 33c.

In other words, an output of the I-side code converter 312c to the eighth amplifier 32c is {I1A, I2A, I3A, ... }, and an output to the ninth amplifier 33c is {I1B, I2B, I3B, ... }. Moreover, an output of the Q-side code converter 312c' to the eighth amplifier 32c is {Q1A, Q2A, Q3A, ... }, and an output to the ninth amplifier 33c is {Q1B, Q2B, Q3B, ... }. I1A, I1B, Q1A, Q1B, and the like are binary data of 1 or −1.

The DQUC 315c and the DQUC 315c' quadrature-modulate a binary digital signal, and generate binary digital signals to be input to the eighth amplifier 32c and the ninth amplifier 33c, respectively. Repetitive signals which are {1, 0, −1, 0} on an I-side and {0, 1, 0, −1} on a Q-side and which are π/4 phases different from each other are used for digital local signals to be input to the DQUCs 315c and 315c' as local signals, in the same manner as the DQDC 313c.

As a result, a binary digital signal {I1A, Q1A, −I2A, −Q2A, ... } to be input to the eighth amplifier 32c, and a binary digital signal {I1B, Q1B, −I2B, −Q2B, ... } to be input to the ninth amplifier 33c are generated. The signals on both sides are amplified by the eighth amplifier 32c and the ninth amplifier 33c, respectively, and combined by the combiner 35c. A combined signal combined by the combiner 35c has a desired signal component passing through the bandpass filter 40, and is emitted into air by the antenna 50.

Note that the signal processor 31c of the amplification unit 30c in FIG. 10 has a configuration in which the DQDC and the DS are provided at a stage previous to the two-point average FIR filter 311 of the signal processor 31 in FIG. 5, and the DQUC is provided at a stage subsequent to the code converter 312 of the signal processor 31. In the signal processor 31c in FIG. 10, an input signal is quadrature-demodulated and down-converted onto the baseband in the DQDC, and then a data rate is reduced by half in the DC. Thus, the two-point average FIR filters 311c and 311c' in FIG. 10 can operate at a clock rate half that of the two-point average FIR filter 311 in FIG. 5.

Because a cutoff frequency of an FIR filter is proportional to a clock rate, cutoff frequencies of the two-point average FIR filters 311c and 311c' are half a cutoff frequency of the two-point average FIR filter 311. Thus, in the two-point average FIR filters 311c and 311c', a quantization noise component of up to a lower frequency component in quantization noise included in an input signal, in other words, quantization noise components in a wider frequency range can be removed. As a result, the amplification unit 30c in FIG. 10 can generate a signal higher in signal-to-noise ratio and power efficiency than the amplification unit 30 in FIG. 5.

Furthermore, the amplification unit 30c in FIG. 10 can have the three-point average FIR filter 311a, the code converter 312a, the third amplifier 32a, and the fourth amplifier 33a in FIG. 6 instead of the two-point average FIR filters 311c and 311c', the code converters 312c and 312c', the eighth amplifier 32c, and the ninth amplifier 33c. Likewise, the amplification unit 30c in FIG. 10 can have the four-point average FIR filter 311b, the code converter 312b, the fifth amplifier 32b, the sixth amplifier 33b, and the seventh amplifier 34b in FIG. 9. As a result, the amplification unit 30c in FIG. 10 can generate a signal higher in signal-to-noise ratio and power efficiency than the amplification unit 30a in FIG. 6 and the amplification unit 30b in FIG. 9.

Furthermore, the two-point average FIR filters 311c and 311c' of the signal processor 31c can be replaced with other digital circuits such as an infinite impulse response (IIR) filter and a Bessel filter by suitably setting a conversion rule provided by a subsequent-stage code converter, and the number of subsequent amplifiers and a voltage amplification factor.

Note that power amplifiers used for the amplification units 30, 30a, 30b, and 30c are not limited to class-D amplifiers, and can also be other general amplifiers.

Note that a multivalue digital signal is generated in the signal processors 31, 31a, 31b, and 31c not exclusively by an FIR filter, and can also be generated by some other multivalue conversion circuit that enables multivalue conversion for reducing quantization noise.

Difference and variation of a proportional relationship between a multivalue digital signal generated in the FIR filter of the signal processors 31, 31a, 31b, and 31c and a combined signal combined after amplification are permitted within a range permitted by processing on a side receiving a transmission signal. For example, variation resulting from noise or the like is permitted. Therefore, it can be said that a combined signal has an approximately proportional relationship with a multivalue digital signal generated in the FIR filter.

As described above, the transmitter 10 according to the present example embodiment generates a binary digital signal from a desired signal to be transmitted (an input signal to be input to the digital baseband generator 211), and generates a K-value (multivalue) digital signal (K is an integer greater than or equal to 3) from the binary digital signal. Further, the transmitter 10 generates a plurality of binary digital signals from the K-value digital signal, and amplifies the plurality of binary digital signals, respectively. Further, the transmitter 10 combines the plurality of amplified binary digital signals, and thus generates a combined signal having an approximately proportional relationship with the K-value digital signal. Further, the transmitter 10 inputs the combined signal to a filter, and transmits a desired signal component which has passed through the filter.

Figure 17:
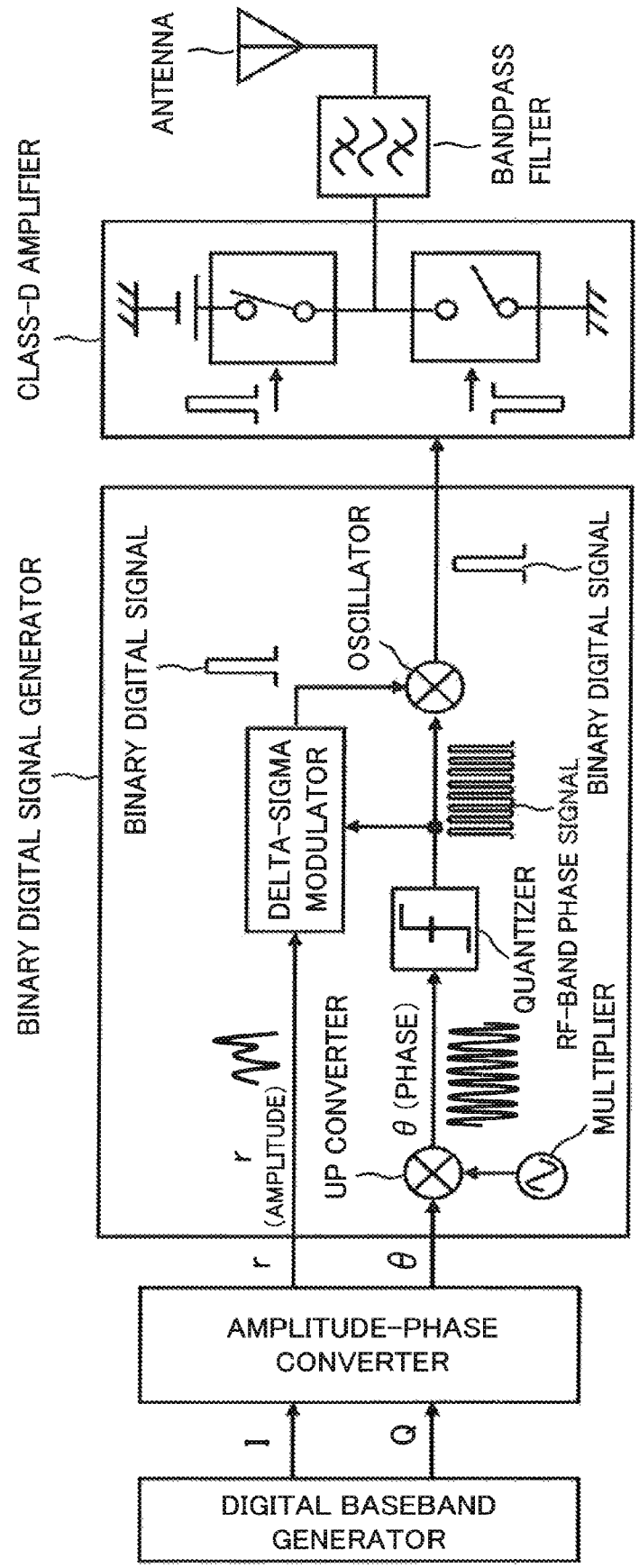
FIG. 17 is a block diagram illustrating a configuration of a transmitter disclosed in PTL 1.
Figure 18:
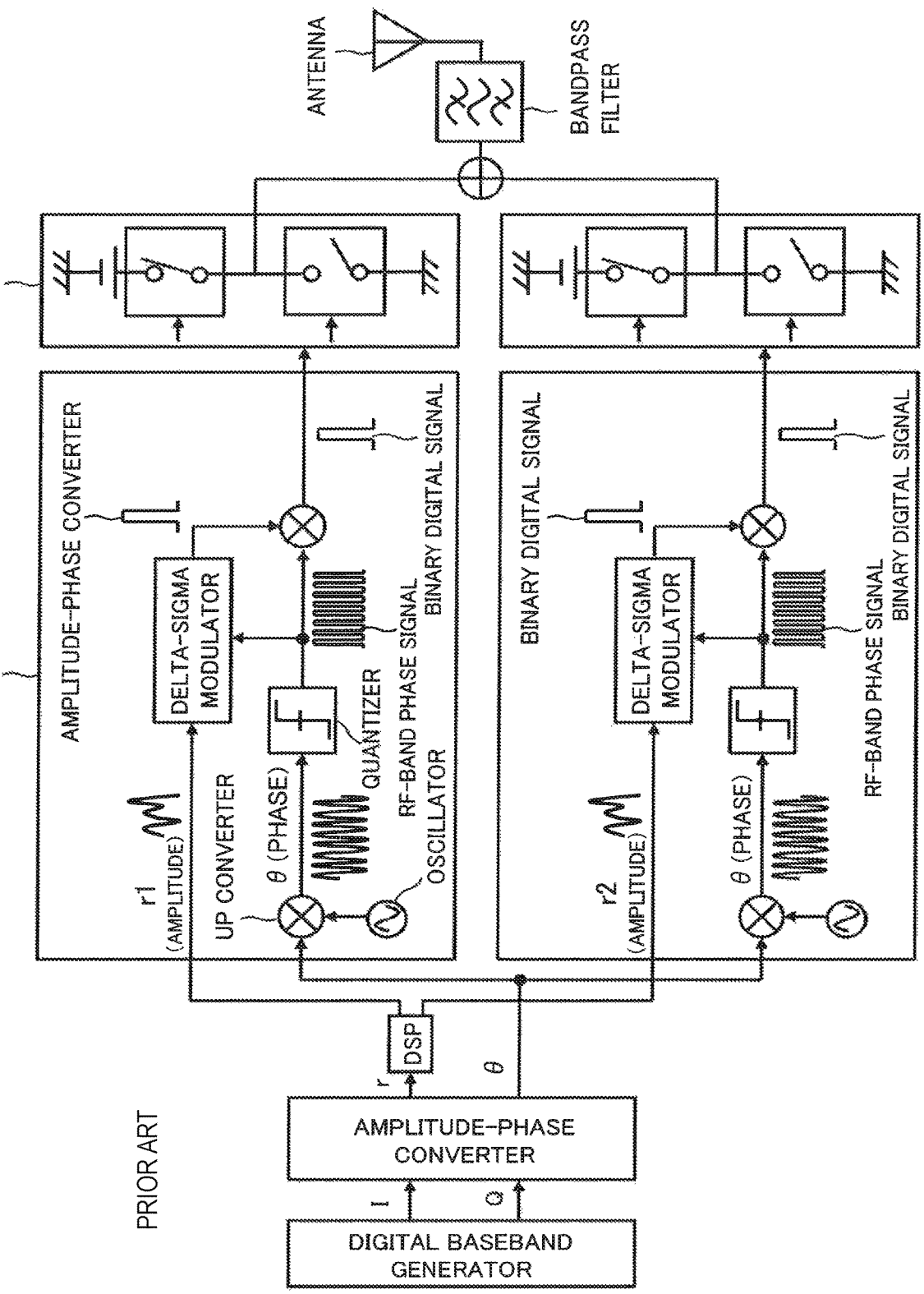
FIG. 18 is a block diagram illustrating a configuration of a transmitter disclosed in NPL 2.

This combined signal has reduced quantization noise and a higher signal-to-noise ratio, as compared with a signal generated by the transmitter in FIGS. 15 and 17. Moreover, power efficiency is also higher because of the reduction of a noise component. In addition, the transmitter 10 only needs one wire between the signal generation unit 20 which generates a binary digital signal, and the amplification unit 30. Thus, a problem of complication of wiring occurring in the transmitter in FIG. 18 is suppressed.

As described above, According to the present example embodiment, it is possible to provide a transmitter having high signal-to-noise ratio of a transmitting signal and high power efficiency. It is also possible to provide a transmitter whose complication of wiring is suppressed. The wiring links a signal generation unit for generating a binary digital signal in an amplification process and an amplification unit for amplifying the binary digital signal.

Third Example Embodiment

Figure 13:
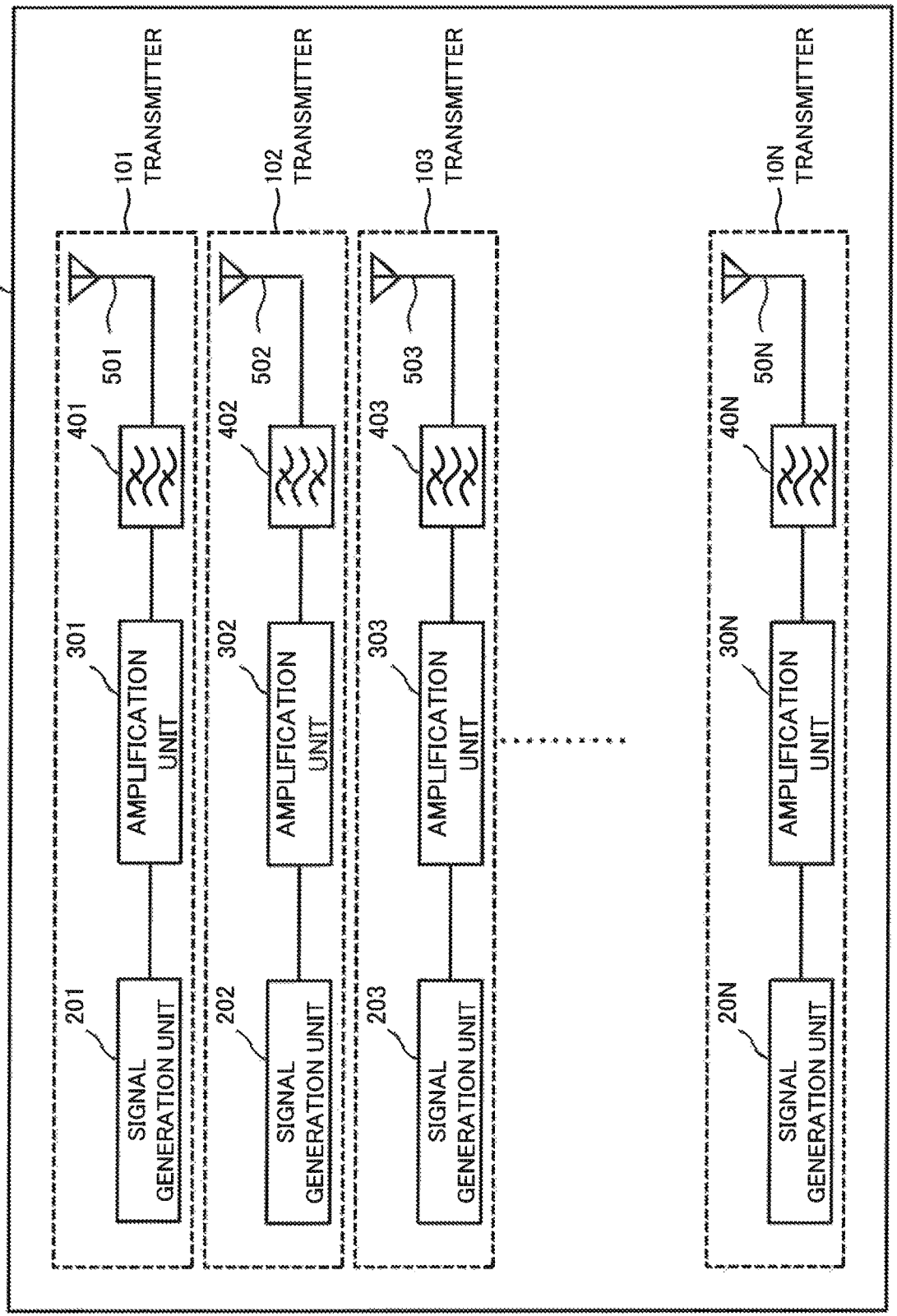
FIG. 13 is a block diagram illustrating a configuration of a multi-antenna device according to a third example embodiment of the present invention.
Figure 14:
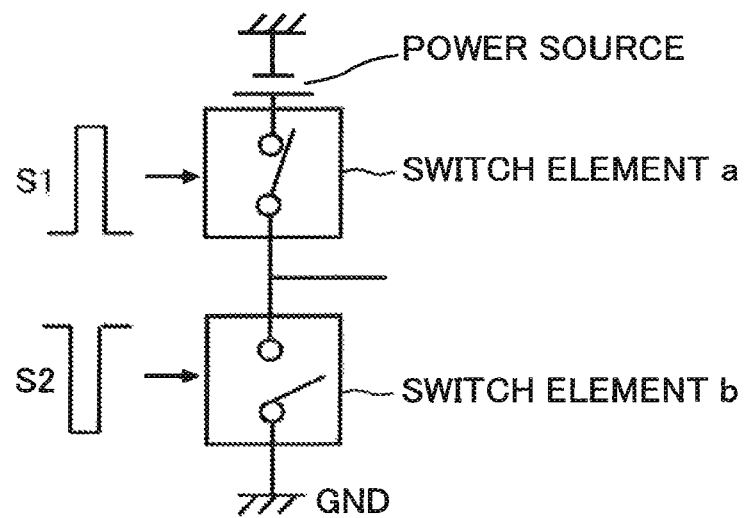
FIG. 14 is a diagram illustrating a configuration of a class-D amplifier.

FIG. 13 is a block diagram illustrating a configuration of a multi-antenna device according to a third example embodiment of the present invention. A multi-antenna device 100 according to the present example embodiment includes a plurality of antennas 501, 502, 503, . . . , and 50N (N is an integer greater than or equal to 2). Each antenna is provided in each of a plurality of transmitters 101, 102, 103, . . . 10N.

The transmitters 101, . . . , and 10N include signal generation units 201, . . . , and 20N, amplification units 301, . . . , and 30N, bandpass filters 401, . . . , and 40N, and antennas 501, . . . , and 50N, respectively. The transmitters 101, . . . , and 10N can be the transmitters 1 according to the first example embodiment or the transmitters 10 according to the second example embodiment.

When the multi-antenna device 100 has N antennas, the multi-antenna device 100 has N signal generation units and N amplification units, respectively, and the number of wires linking the signal generation units and the amplification units is N. In a configuration in FIG. 18, two wires link each signal generation unit and the amplification unit, and the number of wires is therefore 2N in the case of a multi-antenna device. In other words, because the number of wires is half in the present example embodiment, a problem of complication of device wiring is suppressed.

As described above, according to the present example embodiment, it is possible to provide a multi-antenna device having a transmitter which has high signal-to-noise ratio of a transmitting signal and high power efficiency. Complication of wiring is suppressed in the transmitter. The wiring links a signal generation unit for generating a binary digital signal in an amplification process and an amplification unit for amplifying the binary digital signal.

Fourth Example Embodiment

Figure 19:
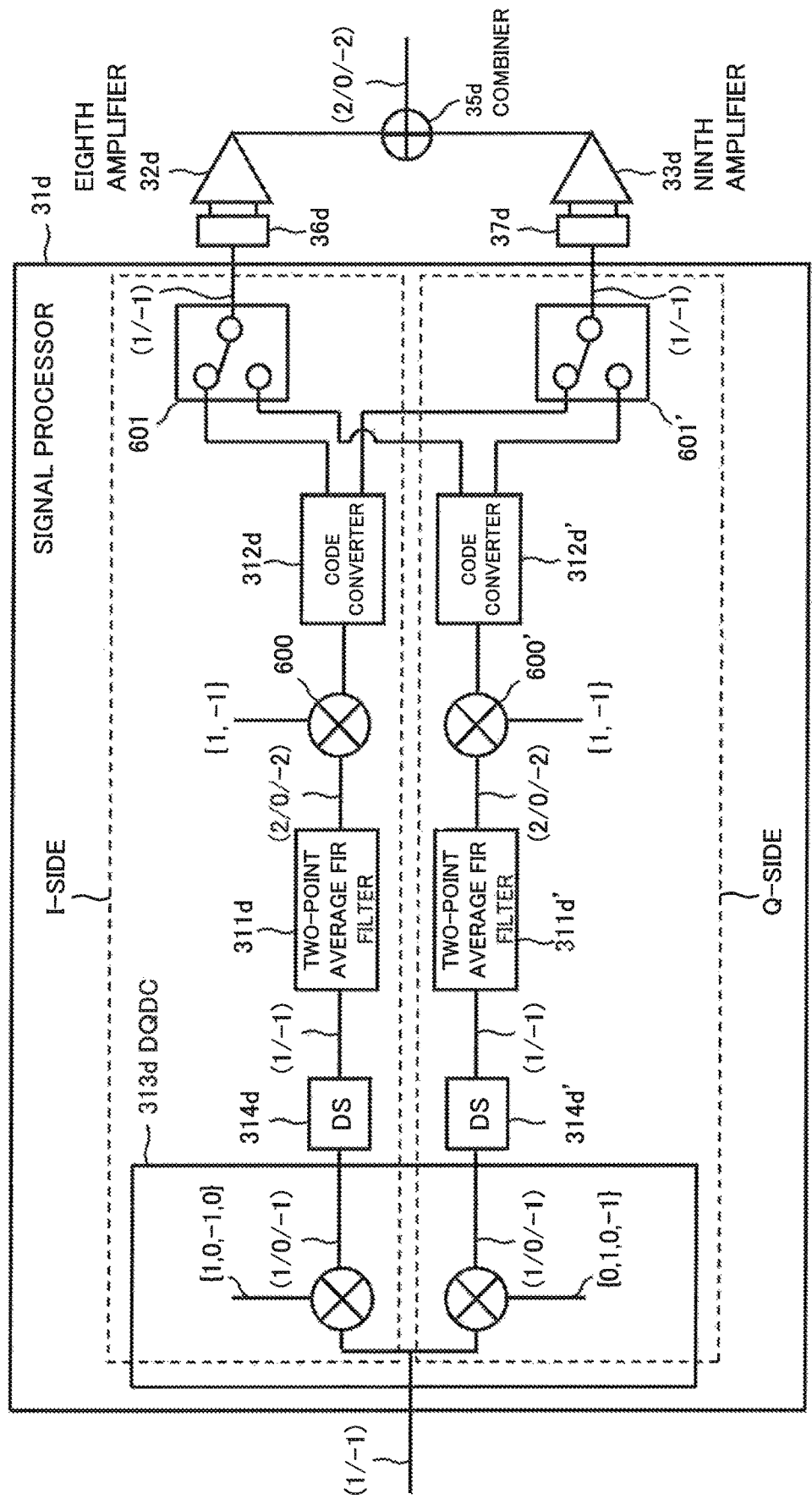
FIG. 19 is a diagram illustrating configurations of a signal processor and amplifiers of an amplification unit of a transmitter according to a fourth example embodiment of the present invention.

FIG. 19 is a diagram illustrating a configuration of an amplification unit of a transmitter according to a fourth example embodiment of the present invention. The transmitter according to the present example embodiment has the same configuration as the transmitter 10 according to the second example embodiment of the present invention illustrated in FIG. 2, and a configuration of an amplification unit 30 is different. Specifically, a configuration of an amplification unit 30d according to the present example embodiment is different from a configuration of the amplification unit 30c according to the second example embodiment illustrated in FIG. 10 in a configuration of a signal processor. In other words, a signal processor 31d of the amplification unit 30d according to the present example embodiment is different in that the code converters 312c and 312c' and the DQUCs 315c and 315c' of the signal processor 31c of the amplification unit 30c are replaced with digital mixers 600 and 600', code converters 312d and 312d', and selectors 601 and 601'.

In each of I-side and Q-side channels of the signal processor 31d, operations of a DQDC 313d, DSs 314d and 314d', and up to two-point average FIRs 311d and 311d' are similar to an operation in the signal processor 31c in FIG. 10.

Output signals of the two-point average FIRs 311d and 311d' are alternately multiplied by 1 and −1 in order in the digital mixers 600 and 600', and output to the code converters 312d and 312d', respectively. The code converters 312d and 312d' perform code conversion under a conversion rule similar to that of the code converter 312 illustrated in FIG. 5, and output signals to the selectors 601 and 601'. The selectors 601 and 601' have a switching rate double a data rate of a signal to be input, and output signals to driver amplifiers 36d and 37d while alternately switching the outputs of the I-side code converter 312d and the Q-side code converter 312d'.

Operations of the driver amplifiers 36d and 37d, an eighth amplifier 32d, a ninth amplifier 33d, and a combiner 35d are similar to operations of those of the amplification unit 30c in FIG. 10.

FIG. 20 is a diagram illustrating output signals of the two-point average FIR filters 311d and 311d', the digital mixers 600 and 600', the code converters 312d and 312d', and the selectors 601 and 601' which are components of the signal processor 31d. Output signals of up to the two-point average FIR filters 311d and 311d' are similar to the output signals of the signal processor 31c in FIG. 10 illustrated in FIGS. 11 and 12.

Output signals of the two-point average FIRs 311d and 311d' are alternately multiplied by 1 and −1 in the digital mixers 600 and 600', and become {I1, −I2, I3, −I4 . . . } and {Q1, −Q2, Q3, −Q4 . . . }, respectively.

Herein, a relationship between an output IxA' (x is a positive integer) to the eighth amplifier 32d and an output IxB' to the ninth amplifier 33d from the I-side code converter 312d, and a relationship between an output QxA' to the eighth amplifier 32d and an output QxB' to the ninth amplifier 33d from the Q-side code converter 312d' are as follows: when x is an odd number, $$IxA'+IxB'=Ix$$

$$QxA'+QxB'=Qx, \text{ and}$$

when x is an even number, $$IxA'+IxB'=-Ix$$

$$QxA'+QxB'=-Qx.$$

Note that in the case of the signal processor 31c illustrated in FIG. 12, $$IxA+IxB=Ix$$

$$QxA+QxB=Qx,$$

whether x is an odd number or an even number.

In other words, a sum of a signal {I1A', Q1A', I2A', Q2A', . . . } to the eighth amplifier 32d and a signal {I1B', Q1B', I2B', Q2B, . . . } to the ninth amplifier 33d output while being alternately switched in the selectors 601 and 601' is {I1, Q1, −I2, −Q2, . . . }. This is the same as a sum of output signals {I1A, Q1A, −I2A, −Q2A, . . . } and {I1B, Q1B, −I2B, −Q2B . . . } of the signal processor 31c illustrated in FIG. 12.

Herein, amplification factors of the eighth amplifier 32d and the ninth amplifier 33d of the amplification unit 30d are equal, like amplification factors of the eighth amplifier 32c and the ninth amplifier 33c of the amplification unit 30c. Therefore, an output of the transmitter obtained by combining outputs of the eighth amplifier 32d and the ninth amplifier 33d to which a signal of the signal processor 31d is input is the same as an output of the transmitter in the case where the signal processor 31c is used.

As described above, the amplification unit 30d using the signal processor 31d is capable of amplification similar to that of the amplification unit 30c. Moreover, the two-point average FIR filters 311d and 311d' of the signal processor 31d can operate at a clock rate half that of the two-point average FIR filter 311 in FIG. 5, like the two-point average FIR filters 311c and 311c' of the signal processor 31c. Therefore, like the amplification unit 30c in FIG. 10, the amplification unit 30d in FIG. 19 can generate a signal higher in signal-to-noise ratio and power efficiency than the amplification unit 30 in FIG. 5.

On the other hand, the respective signals output from the signal processor 31d and input to the eighth amplifier 32d and the ninth amplifier 33d are different from those of the signal processor 31c in the following points.

Specifically, in the signal processor 31d, when both of the I-side and the Q-side two-point average FIRs 311d and 311d' keep outputting 0, outputs of the digital mixers 600 and 600' are also 0, and inputs of the code converters 312d and 312d' are always 0. Due to a code conversion rule of the code converter 312 in FIG. 5, the code converters keep outputting 1 to the eighth amplifier 32d and −1 to the ninth amplifier 33d on both of the I and Q sides. In other words, $$I1A'=I2A'=I3A'=I4A'=Q1A'=Q2A'=Q3A'=Q4A'=1,$$
and $$I1B'=I2B'=I3B'=I4B'=Q1B'=Q2B'=Q3B'=Q4B'=-1.$$

Therefore, outputs of the signal processor 31d to the eighth amplifier 32d and the ninth amplifier 33d are constant and always 1 to the eighth amplifier 32d and always −1 to the ninth amplifier 33d. That input signals to the eighth amplifier 32d and the ninth amplifier 33d are constant means that these amplifiers do not perform a switching operation. In other words, it means that power consumption associated with a switching operation is suppressed.

On the other hand, in the case of the signal processor 31c in FIG. 10 according to the second example embodiment, when an output of the FIR filter is 0, outputs of the code converters 312c and 312c' are $$I1A=I2A=I3A=I4A=Q1A=Q2A=Q3A=Q4A=1, \text{ and}$$

$$I1B=I2B=I3B=I4B=Q1B=Q2B=Q3B=Q4B=-1,$$

with reference to FIG. 12. Further, because outputs of the signal processor 31c are {I1A, Q1A, −I2A, −Q2A, I3A, Q3A, −I4A, −Q4A, . . . } and {I1B, Q1B, −I2B, −Q2B, I3B, Q3B, −I4B, −Q4B, . . . }, both of the outputs become a signal in which after 1 or −1 continues twice, 1 and −1 are interchanged. This means that the eighth and ninth amplifiers perform a switching operation, and power consumption associated with the switching operation is produced.

In other words, according to the amplification unit 30d in the present example embodiment, power consumption associated with a switching operation can be suppressed, and it is thus possible to provide a transmitter higher in efficiency than when the amplification unit 30c in FIG. 10 according to the second example embodiment is used.

Figure 21:
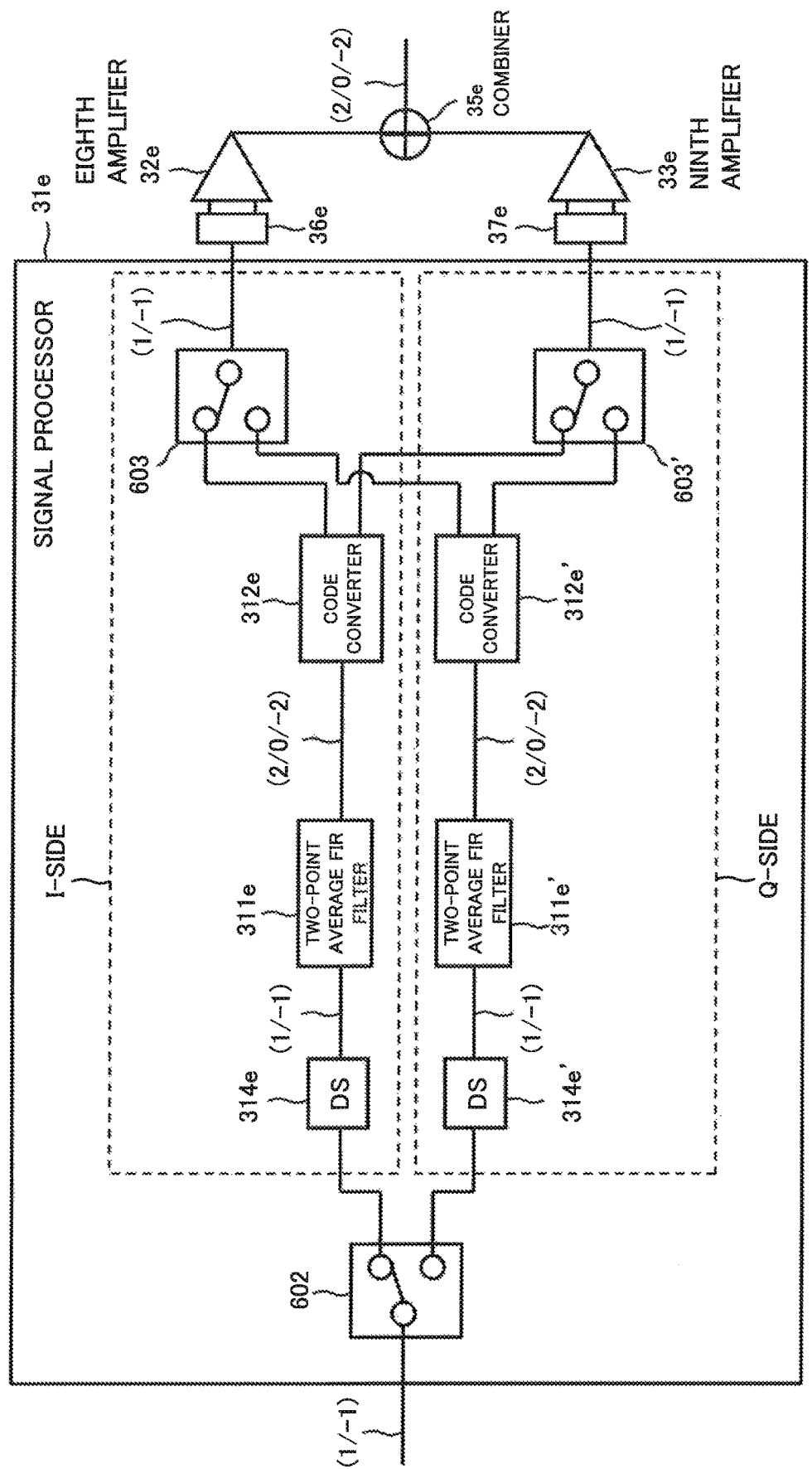
FIG. 21 is a diagram illustrating an alternative configuration of a signal processor of an amplification unit of the transmitter according to the fourth example embodiment of the present invention.

FIG. 21 is a diagram illustrating an alternative configuration of a signal processor of an amplification unit of the transmitter according to the present example embodiment. A signal processor 31e of an amplification unit 30e in FIG. 21 includes a selector 602, DSs 314e and 314e', two-point average FIRs 311e and 311e', code converters 312e and 312e', and selectors 603 and 603'. The signal processor 31e is different from the signal processor 31d in FIG. 19 in that the DQDC 313d is replaced with the selector 602, and the digital mixers 600 and 600' are eliminated. The signal processor 31e is similar in other configurations to the signal processor 31d. Moreover, the amplification unit 30e is different from the amplification unit 30d in FIG. 19 in the signal processor 31e. Operations of other driver amplifiers 36e and 37e, an eighth amplifier 32e, a ninth amplifier 33e, and a combiner 35e are similar to operations of those of the amplification unit 30d.

FIG. 22 is a diagram illustrating output signals of the selector 602, the DSs 314e and 314e', the two-point average FIRs 311e and 311ed', the code converters 312e and 312e', and the selectors 603 and 603' which are components of the signal processor 31e.

The selector 602 outputs an output signal {d1, 0, d3, 0, . . . } to the I-side DS 314e, and an output signal {0, d2, 0, d4, . . . } to the Q-side DS 314e'. The DSs 314e and 314e' output output signals {d1, d3, d5, d7, . . . } and {d2, d4, d6, d8, . . . } having a clock rate which is ½ of that of an input signal, respectively. The two-point average FIRs 311e and 311e' output output signals {IL 12, 13, 14, . . . } and {Q1, Q2, Q3, Q4, . . . }, respectively, like the two-point average FIRs 311d and 311d' in FIG. 19.

The code converter 312e outputs {I1A', I2A', I3A', I4A', . . . } to an I-side of the eighth amplifier 32e, and {I1B', I2B', I3B', I4B', . . . } to an I-side of the ninth amplifier 33e, like the code converter 312d in FIG. 19. The code converter 312e' outputs {Q1A', Q2A', Q3A', Q4A', . . . } to a Q-side of the eighth amplifier 32e, and {Q1B', Q2B', Q3B', Q4B', . . . } to a Q-side of the ninth amplifier 33e, like the code converter 312d' in FIG. 19.

The selector 603 outputs {I1A', Q1A', I2A', Q2A', I3A', Q3A', I4A', Q4A', . . . } to the eighth amplifier 32e side, like the selector 601 in FIG. 19. The selector 603' outputs {I1B', Q1B', I2B', Q2B', I3B', Q3B', I4B', Q4B', . . . } to the ninth amplifier 33e side, like the selector 601' in FIG. 19.

As described above, in the amplification unit 30e using the signal processor 31e, the signal processor 31e performs the same output as the signal processor 31d, and amplification similar to that in the amplification unit 30d is possible. Moreover, the two-point average FIR filters 311e and 311e' of the signal processor 31e can operate at a clock rate half that of the two-point average FIR filter 311 in FIG. 5, like the two-point average FIR filters 311d and 311d' of the signal processor 31d. Therefore, like the amplification unit 30d in FIG. 19, the amplification unit 30e in FIG. 21 can generate a signal higher in signal-to-noise ratio and power efficiency than the amplification unit 30 in FIG. 5.

Figure 23:
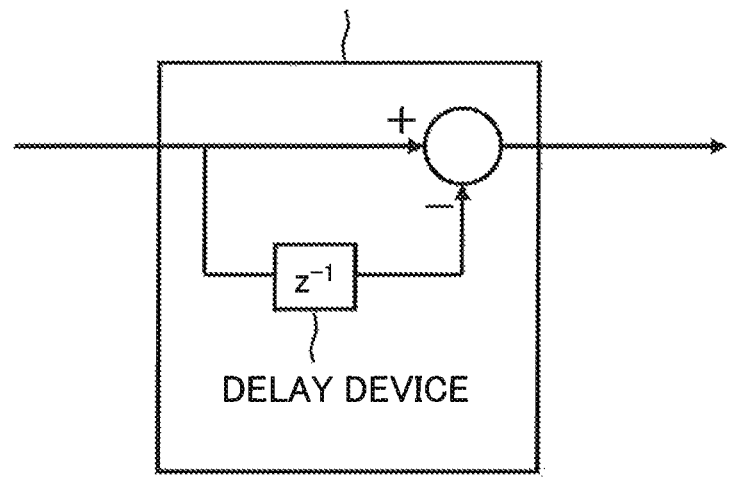
FIG. 23 is a diagram illustrating a two-point difference FIR filter that can be used for the signal processor of the amplification unit of the transmitter according to the fourth example embodiment of the present invention.

Note that the two-point average FIR filters 311e and 311e' can be a two-point difference FIR filter as illustrated in FIG. 23. This two-point difference FIR filter has a transfer function $H(z)$ of $1-Z^{-1}$, and is a high-pass filter having a pass band near Nyquist frequency which is ½ of a sampling frequency. By using this two-point difference FIR filter, the signal processor 31e can pass a high-frequency-side signal without using a circuit such as a DQDC and a digital mixer for converting a frequency.

By using the aforementioned high-pass filter, the signal processor 31e can output a high-frequency signal without using a frequency converter such as a DQDC and a digital mixer, and can generate a high-frequency signal more simply and at lower cost than the signal processor 31d.

Figure 24:
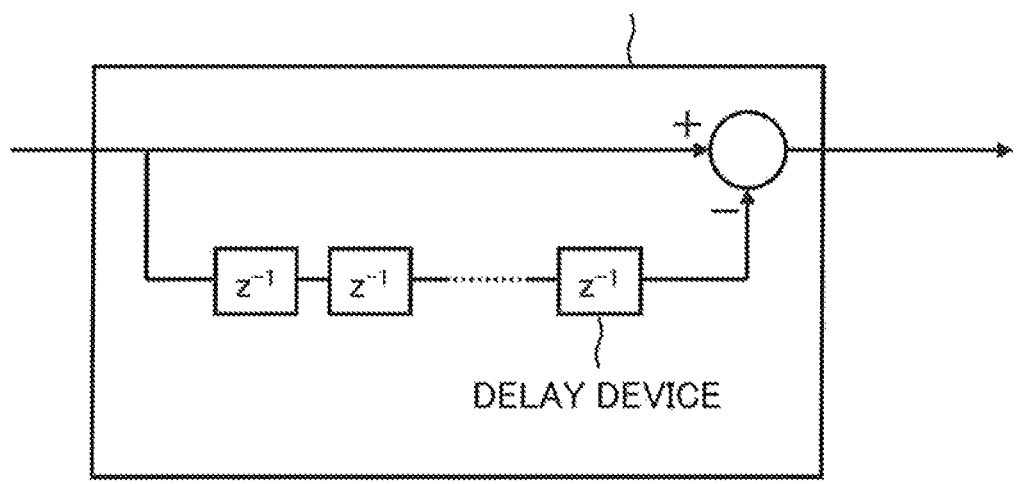
FIG. 24 is a diagram illustrating a two-point difference FIR filter that can be used for the signal processor of the amplification unit of the transmitter according to the fourth example embodiment of the present invention.

Note that the two-point difference FIR filter in FIG. 23 may be a two-point difference FIR filter having two or more delay devices illustrated in FIG. 24. For example, an FIR filter having two delay devices has a transfer function of $1-Z^{-2}$, and a pass band set near ½ of Nyquist frequency. Note that a similar configuration of the two-point difference FIR filter in FIG. 24 may be a configuration which takes a sum of a delay device and an input signal. For example, a transfer function of an FIR filter having four delay devices is $1+Z^{-4}$. In this case as well, a pass band is set near ½ of Nyquist frequency.

Note that the two-point difference FIR filters in FIGS. 23 and 24 can be used not only for the signal processors 31d and 31e according to the present example embodiment, but also for the signal processors 31, 31a, 31b, and 31c according to the second example embodiment.

Note that the amplification unit 30d and the amplification unit 30e according to the present example embodiment can be used for the amplification units 301, . . . , and 30N of the multi-antenna device 100 according to the third example embodiment.

A transmitter using the amplification unit according to the present example embodiment for the amplification unit 30 in FIG. 2 generates a binary digital signal from a desired signal that is desired to be transmitted (an input signal to be input to the digital baseband generator 211), and generates a ternary digital signal from the binary digital signal. Further, the transmitter generates a plurality of binary digital signals from the ternary digital signal, and amplifies the plurality of binary digital signals, respectively. Further, the transmitter combines the plurality of amplified binary digital signals, and thus generates a combined signal having an approximately proportional relationship with the ternary digital signal. Further, the transmitter inputs the combined signal to a filter, and transmits a desired signal component which has passed through the filter.

This combined signal has reduced quantization noise and a higher signal-to-noise ratio, as compared with a signal generated by the transmitter in FIGS. 15 and 17. Moreover, power efficiency is also higher because of the reduction of a noise component. In addition, the present transmitter only needs one wire between a signal generation unit which generates a binary digital signal, and an amplification unit. Thus, a problem of complication of wiring occurring in the transmitter in FIG. 18 is suppressed.

As described above, according to the present example embodiment, it is possible to provide a transmitter having high signal-to-noise ratio of a transmitting signal and high power efficiency. It is also possible to provide a transmitter whose complication of wiring is suppressed. The wiring links a signal generation unit for generating a binary digital signal in an amplification process and an amplification unit for amplifying the binary digital signal.

The present invention is not limited to the example embodiments described above, and various modifications can be made within the scope of the invention described in CLAIMS and also fall within the scope of the present invention.

Furthermore, some or all of the example embodiments described above can also be described as in Supplementary notes below, but not limited to the followings.

(Supplementary Note 1)

A transmitter comprising: a signal generation unit which generates a binary digital signal; and an amplification unit comprising a signal processor which generates a K-value digital signal (K is an integer greater than or equal to 3) from the binary digital signal and generates a plurality of binary digital signals from the K-value digital signal, a plurality of amplifiers which amplify the plurality of binary digital signals, respectively, and a combiner which combines the plurality of amplified binary digital signals, and generates a combined signal having an approximately proportional relationship with the K-value digital signal.

(Supplementary Note 2)

The transmitter according to Supplementary note 1, wherein the signal processor comprises a digital filter which generates the K-value digital signal, and a code converter which generates the plurality of binary digital signals from the K-value digital signal.

(Supplementary Note 3)

The transmitter according to Supplementary note 2, wherein the code converter generates the plurality of binary digital signals in a way that the K-value digital signal and the combined signal have an approximately proportional relationship.

(Supplementary Note 4)

The transmitter according to Supplementary note 2 or 3, wherein the amplification unit has an amplification factor weighted in a way that the K-value digital signal and the combined signal have an approximately proportional relationship.

(Supplementary Note 5)
The transmitter according to any one of Supplementary notes 2 to 4, wherein the digital filter has an FIR filter.
(Supplementary Note 6)
The transmitter according to any one of Supplementary notes 1 to 5, further comprising: at a stage previous to the signal processor, a digital quadrature down converter which generates I/Q quadrature signals from the binary digital signals, and a down-sampler which down-samples each of the I/Q quadrature signals; and
at a stage subsequent to the signal processor, a digital quadrature up converter which quadrature-modulates each output of the signal processor and inputs each quadrature-modulated output to each of the plurality of amplifiers.
(Supplementary Note 7)
The transmitter according to any one of Supplementary notes 1 to 6, wherein the amplifier includes a class-D amplifier.
(Supplementary Note 8)
The transmitter according to any one of Supplementary notes 1 to 7, further including: a filter to which the combined signal is input; and an antenna which transmits an output of the filter.
(Supplementary Note 9)
The transmitter according to any one of Supplementary notes 1 to 8, wherein the signal generation unit generates a binary digital signal by delta-sigma modulation.
(Supplementary Note 10)
The transmitter according to Supplementary note 1, wherein the signal processor includes a digital quadrature down converter which generates each of I/Q quadrature signals from the binary digital signals, a down-sampler which down-samples each of the I/Q quadrature signals, a digital filter which generates a K-value digital signal from each of the down-sampled I/Q quadrature signals, a digital mixer which up-converts each of the K-value digital signals generated by the digital filter, a code converter which generates a binary digital signal from each of the up-converted K-value digital signals, and a selector which alternately selects each of the binary digital signals generated by the code converter, and generates a binary digital signal to be output to each of the plurality of amplifiers.
(Supplementary Note 11)
The transmitter according to Supplementary note 1, wherein the signal processor includes a first selector which divides the binary digital signal into a plurality of binary digital signals, a down-sampler which down-samples each of the plurality of divided binary digital signals, a digital filter which generates a K-value digital signal from each of the down-sampled binary digital signals, a code converter which generates a binary digital signal from each of the K-value digital signals generated by the digital filter, and a second selector which alternately selects each of the binary digital signals generated by the code converter, and generates a binary digital signal to be output to each of the plurality of amplifiers.
(Supplementary Note 12)
The transmitter according to Supplementary note 5, 10, or 11, wherein the digital filter is an FIR filter which outputs a difference between an input signal and a delay signal of the input signal.
(Supplementary Note 13)
A multi-antenna device including a plurality of transmitters according to any one of Supplementary notes 1 to 12.
(Supplementary Note 14)
A transmission method including:
generating a binary digital signal;
generating a K-value digital signal (K is an integer greater than or equal to 3) from the binary digital signal;
generating a plurality of binary digital signals from the K-value digital signal;
amplifying the plurality of binary digital signals, respectively; and
combining the plurality of amplified binary digital signals, and generating a combined signal having an approximately proportional relationship with the K-value digital signal.
(Supplementary Note 15)
The transmission method according to Supplementary note 14, wherein the plurality of binary digital signals are generated in a way that the K-value digital signal and the combined signal have an approximately proportional relationship.
(Supplementary Note 16)
The transmission method according to Supplementary note 14 or 15, further including amplifying at an amplification factor weighted in a way that the K-value digital signal and the combined signal have an approximately proportional relationship.
(Supplementary Note 17)
The transmission method according to any one of Supplementary notes 14 to 16, further including: generating I/Q quadrature signals from the binary digital signals;
down-sampling each of the I/Q quadrature signals;
generating the K-value digital signal from each of the down-sampled I/Q quadrature signals;
generating each of a plurality of binary digital signals from the K-value digital signal;
quadrature-modulating the plurality of binary digital signals;
amplifying each of the plurality of quadrature-modulated binary digital signals; and
combining the plurality of amplified binary digital signals, and generating a combined signal.
(Supplementary Note 18)
The transmission method according to any one of Supplementary notes 14 to 17, wherein the amplification is performed by a class-D amplifier.
(Supplementary Note 19)
The transmission method according to any one of Supplementary notes 14 to 18, wherein the combined signal is transmitted after being passed through a filter.
(Supplementary Note 20)
The transmission method according to any one of Supplementary notes 14 to 19, wherein the binary digital signal is generated by delta-sigma modulation.
(Supplementary Note 21)
The transmission method according to Supplementary note 14, further including: generating each of I/Q quadrature signals from the binary digital signals;
down-sampling each of the I/Q quadrature signals;
generating a K-value digital signal from each of the down-sampled I/Q quadrature signals;
up-converting each of the K-value digital signals;
generating a binary digital signal from each of the up-converted K-value digital signal; and
alternately selecting each of the binary digital signals, and generating binary digital signals which are each subjected to the amplification.
(Supplementary Note 22)
The transmission method according to Supplementary note 14, further including: dividing the binary digital signal into a plurality of binary digital signals;
down-sampling each of the plurality of divided binary digital signals;

generating a K-value digital signal from each of the down-sampled binary digital signals;
generating a binary digital signal from each of the K-value digital signals; and
alternately selecting each of the binary digital signals, and generating 230-value digital signals which are each subjected to the amplification.

This application is based upon and claims the benefit of priority from Japanese patent application No. 2015-220991, filed on Nov. 11, 2015, and Japanese patent application No. 2016-167964, filed on Aug. 30, 2016, the disclosures of which are incorporated herein in their entireties by reference.

REFERENCE SIGNS LIST

1 Transmitter
2 Signal generation unit
3 Amplification unit
4 Signal processor
5 Amplifier
6 Combiner
10 Transmitter
20 Signal generation unit
21 Signal generator
211 Digital baseband generator
212 Amplitude-phase converter
22 Signal modulator
221 Delta-sigma modulator
222 Up converter
223 Oscillator
224 Quantizer
225 Mixer
30, 30a, 30b, 30c, 30d, 30e Amplification unit
31, 31a, 31b, 31c, 31d, 31e Signal processor
311, 311c, 311c', 311d, 311d', 311e, 311e' Two-point average FIR filter
311a Three-point average FIR filter
311b Four-point average FIR filter
312, 312a, 312b, 312c, 312c', 312d, 312d', 312e, 312e' Code converter
313c, 313d DQDC
314c, 314c', 314d, 314d', 314e, 314e' DS
315c, 315c' DQUC
32 First amplifier
33 Second amplifier
32a, 32a' Third amplifier
33a, 33a' Fourth amplifier
32b Fifth amplifier
33b Sixth amplifier
34b Seventh amplifier
32c, 32d, 32e Eighth amplifier
33c, 33d, 33e Ninth amplifier
35, 35a, 35a', 35b, 35c, 35d, 35e Combiner
36, 36a, 36b, 36c, 36d, 36e, 37, 37a, 37b, 37c, 37d, 37e, 38b Driver amplifier
321, 322, 331, 332 Switch element
323, 333 Power source
324a', 334a' Impedance transformer
100 Multi-antenna device
101 Transmitter
201 Signal generation unit
301 Amplification unit
401 Bandpass filter
501 Antenna
600, 600' Digital mixer
601, 601', 602, 603, 603' Selector

What is claimed is:

1. An amplifier configured to:
   generate a K-value digital signal (K is an integer greater than or equal to 3) from a binary digital signal;
   generate a plurality of binary digital signals from the K-value digital signal;
   amplify the plurality of binary digital signals, respectively;
   combine the plurality of amplified binary digital signals;
   generate the K-value digital signal using a digital filter; and
   generate the plurality of binary digital signals from the K-value digital signal using a code converter.

2. The amplifier according to claim 1, wherein the code converter generates the plurality of binary digital signals in a way that the K-value digital signal and the combined signal have an approximately proportional relationship.

3. The amplifier according to claim 1, further configured to:
   amplify the K-value digital signal wherein an amplification factor weighted in a way that the K-value digital signal and the combined signal have an approximately proportional relationship.

4. The amplifier according to claim 1, wherein the digital filter comprises an FIR filter.

5. The amplifier according to claim 1, further configured to:
   prior to the generation of the K-value digital signal, generate an I/Q quadrature signal from the binary digital signal, and down-sample each of the I/Q quadrature signals; and
   subsequent to the generation of the K-value digital signal, quadrature-modulate each output of the signal and input each quadrature-modulated output to a plurality of the amplification.

6. The amplifier according to claim 1, wherein the amplification comprises a class-D amplification.

7. The amplifier according to claim 1, further configured to:
   generate each of I/Q quadrature signals from the binary digital signals;
   down-sample each of the I/Q quadrature signals;
   generate a K-value digital signal from each of the down-sampled I/Q quadrature signals;
   up-convert each of the K-value digital signals generated by the digital filtering;
   generate a binary digital signal from each of the up-converted K-value digital signals;
   select each of the binary digital signals generated by the code converting; and
   generate a binary digital signal to be output to each of a plurality of the amplification.

8. The amplifier according to claim 1, further configured to:
   divide the binary digital signal into a plurality of binary digital signals;
   down-sample each of the plurality of divided binary digital signals;
   generate a K-value digital signal from each of the down-sampled binary digital signals;
   generate binary digital signals from each of the K-value digital signals; and
   alternately select each of the binary digital signals generated from each of the K-value digital signals, and generate a binary digital signal to be output to each of a plurality of the amplification.

9. The amplifier according to claim 4, wherein the digital filter is an FIR filter which outputs a difference between an input signal and a delay signal of the input signal.

10. A transmitter comprising:
an amplifier according to claim 1.

11. An amplification method comprising:
generating a binary digital signal;
generating a K-value digital signal (K is an integer greater than or equal to 3) from the binary digital signal;
generating a plurality of binary digital signals from the K-value digital signal;
amplifying the plurality of binary digital signals, respectively;
combining the plurality of amplified binary digital signals;
generating the K-value digital signal using a digital filter; and
generating the plurality of binary digital signals from the K-value digital signal using a code converter.

12. The amplification method according to claim 11, further comprising:
generating an I/Q quadrature signal from the binary digital signal;
down-sampling each of the I/Q quadrature signals;
generating the K-value digital signal from each of the down-sampled I/Q quadrature signals;
generating each of a plurality of binary digital signals from the K-value digital signal;
quadrature-modulating the plurality of binary digital signals;
amplifying each of the plurality of quadrature-modulated binary digital signals; and
combining the plurality of amplified binary digital signals, and generating a combined signal.

13. The amplification method according to claim 11, further comprising:
generating the plurality of binary digital signals in a way that the K-value digital signal and the combined signal have an approximately proportional relationship.

14. The amplification method according to claim 12, further comprising:
generating the plurality of binary digital signals in a way that the K-value digital signal and the combined signal have an approximately proportional relationship.

15. The amplifier according to claim 2, further configured to:
amplify the K-value digital signal wherein an amplification factor weighted in a way that the K-value digital signal and the combined signal have an approximately proportional relationship.

16. The amplifier according to claim 2, wherein the digital filter comprises an FIR filter.

17. The amplifier according to claim 3, wherein the digital filter comprises an FIR filter.

18. The amplifier according to claim 1, further configured to:
prior to the generation of the K-value digital signal, generate an I/Q quadrature signal from the binary digital signal, and down-sample each of the I/Q quadrature signals; and
subsequent to the generation of the K-value digital signal, quadrature-modulate each output of the signal and
input each quadrature-modulated output to a plurality of the amplification.

19. The amplifier according to claim 2, further configured to:
prior to the generation of the K-value digital signal, generate an I/Q quadrature signal from the binary digital signal, and down-sample each of the I/Q quadrature signals; and
subsequent to the generation of the K-value digital signal, quadrature-modulate each output of the signal and input each quadrature-modulated output to a plurality of the amplification.

\* \* \* \* \*